(12) United States Patent
Korczynski et al.

(10) Patent No.: US 6,354,868 B1
(45) Date of Patent: Mar. 12, 2002

(54) VEHICLE POWER DISTRIBUTION BOX

(75) Inventors: Jacek Korczynski, Niles, IL (US); Ronald Lee Spencer, Glendale, AZ (US)

(73) Assignee: Cooper Technologies, Houston, TX (US)

( * ) Notice: Subject to any disclaimer, the term of this patent is extended or adjusted under 35 U.S.C. 154(b) by 0 days.

(21) Appl. No.: 09/319,223
(22) PCT Filed: Oct. 28, 1996
(86) PCT No.: PCT/US96/17208
 § 371 Date: Mar. 23, 2000
 § 102(e) Date: Mar. 23, 2000
(87) PCT Pub. No.: WO98/19371
 PCT Pub. Date: May 7, 1998

Related U.S. Application Data

(63) Continuation-in-part of application No. PCT/US95/10016, filed on Aug. 8, 1995, which is a continuation-in-part of application No. 08/287,623, filed on Aug. 8, 1994, now Pat. No. 5,587,890.

(51) Int. Cl.[7] ............................................... H01R 29/00
(52) U.S. Cl. ........................... 439/516; 439/82; 361/826
(58) Field of Search ........................... 439/82, 49, 516, 439/76.2; 361/826; 174/254

(56) References Cited

U.S. PATENT DOCUMENTS

| | | | | |
|---|---|---|---|---|
| 3,072,734 A | * | 1/1963 | Fox et al. | 174/254 |
| 3,408,452 A | * | 10/1968 | Ruehlemann | 174/254 |
| 4,703,397 A | * | 10/1987 | Minoura et al. | 439/76.2 |

* cited by examiner

Primary Examiner—Tulsidas Patel
(74) Attorney, Agent, or Firm—Armstrong Teasdale LLP

(57) ABSTRACT

A power distribution apparatus includes a conductive plate (100), the conductive plate (100) including plurality of contact pads (101) that are interconnected by removable connecting links (102), each of the contact pads (101) including opening (106) for receiving a connector pin, a housing (811), for the conductive plate, the housing including plurality of connector receptacles (820), and plurality of connector pins selectively mounted on a portion of the receiving opening (106) on the conductive plate so as to align with the connector receptacles (820), wherein a portion of the connecting links (102) are removed to create a circuit on the conductive plate (100).

12 Claims, 22 Drawing Sheets

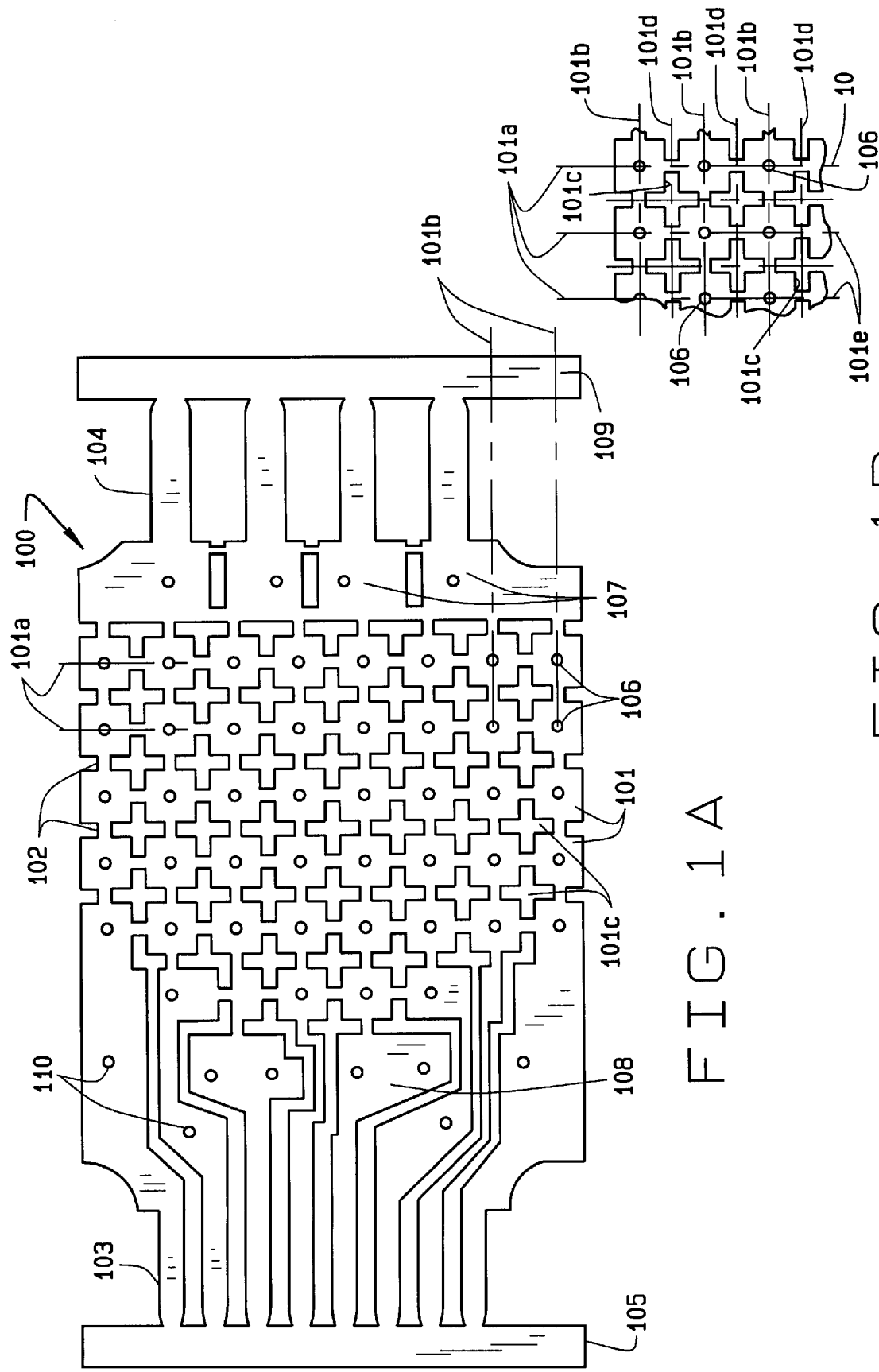

VEHICLE POWER DISTRIBUTION BOX

CROSS-REFERENCE TO RELATED APPLICATIONS

The present application is a continuation-in-part of PCT International application No. PCT/US95/10016, filed on Aug. 8, 1995, which designated the United States of America, and which is a continuation-in-part of U.S. patent application, Ser. No. 08/287,623, which was filed on Aug. 8, 1994.

BACKGROUND OF THE INVENTION

1. Field of the Invention

This invention relates generally to a distribution system for electric power, and in particular to an electrical power distribution system for a vehicle.

2. Description of Related Art

The first motorized vehicles had little in the way of an electrical system. All that was required was some way to generate and distribute an ignition potential to each of the cylinders of the small, internal combustion engine that powered these early vehicles.

The need to see the road ahead during nighttime operation gave rise to the first electrical accessory: headlights. Interior illumination was added for the operator's convenience, and a single tail light was considered adequate. Turn signal lights followed, but the simple vehicle radio receiver did not make its appearance until a number of years later.

The modern automobile is an impressive collection of electrical hardware: from stereo sound equipment to air conditioning; from power windows, mirrors and seats to keyless entry systems; from vehicle alarms to seat position memory to electrically heated seats. The complexity of vehicle electrical systems has grown almost exponentially since the automobile's introduction.

Automotive and truck electrical systems are a formidable combination of high-current and low-current circuitry. In many cases, relays are required for control purposes, and all circuits must be adequately fused to protect expensive components and to guard against the danger of fire. In order to facilitate the replacement of fuses and relays, and to simplify interconnection of electrical hardware, many different electric power distribution systems have been tried.

One approach that has been tried with fair consistency is to centralize fuse and relay mounting, then route input and output connections from this central location. The first systems built using this approach included a great deal of point-to-point wiring. Hand wiring is very costly, and manual wiring operations are a source of wiring errors that negatively impact product quality. In addition, massive wiring bundles create a hazard of shorts or fire.

Another approach has been the construction of customized distribution networks stamped as strips from thin metal sheets—"stamp tracks." These stamp tracks are formed metal sheets that have contact tabs protruding through openings in custom designed plastic shells. Although this approach yields a higher quality product, tooling costs are very high, since virtually every automobile model requires a unique distribution system. At least some of this uniqueness aspect is driven by the proliferation of fuse and relay packages. A distribution product must be able to accommodate the fuse and relay components selected by the manufacturer.

Yet another approach has centered around the use of flexible circuit board technology, or "flex circuits." Flex circuits are constructed by depositing conductive material between two flexible insulating layers. Although the unique distribution requirements of each vehicle model would require unique flex circuits for each application, tooling costs are much lower than the metal stamping/custom plastic housing approach described previously. The principal disadvantage of the flex circuit approach is that the conductive layers are very thin, and the high current densities required in vehicle power distribution lead to overheating and eventual failure.

Consequently, a need arises for a vehicle electric power distribution system that can be customized for a particular vehicle with relative ease, that avoids high tooling costs for custom designed components, that is reliable in a high current environment, that will accommodate a wide range of fuse and relay packages, and that is relatively inexpensive to manufacture.

OBJECTS AND SUMMARY

These needs and others are satisfied by the electrical circuit plates and electric power distribution apparatus of the present invention. The apparatus includes a plurality of conductive circuit plates stacked to provide an electrical distribution system. Each plate has an arrangement of contact pads, wherein at least some of the contact pads are electrically connected to selected other contact pads of the same conductive plate via integrally formed conductive traces. The apparatus further includes a plurality of conductive pins providing electrical contact between selected contact pads of different selected conductive plates.

The present invention further relates to a power distribution apparatus comprising a conductive plate, the conductive plate including a plurality of contact pads that are interconnected by removable connecting links, each of the contact pads including means for receiving a connector pin, a housing for the conductive plate, the housing including a plurality of connector receptacles, and a plurality of connector pins selectively mounted to a portion of the receiving means on the conductive plate so as to align with the connector receptacles, wherein a portion of the connecting links are removed to create a circuit on the conductive plate.

BRIEF DESCRIPTION OF THE DRAWINGS

FIG. 1(a) is an enlarged top plan view of a stamped conductive plate of the present invention;

FIG. 1(b) is a partial enlarged plan view taken along line 1b of FIG. 1(a);

DETAILED DESCRIPTION OF THE PREFERRED EMBODIMENTS

Figure 2A:
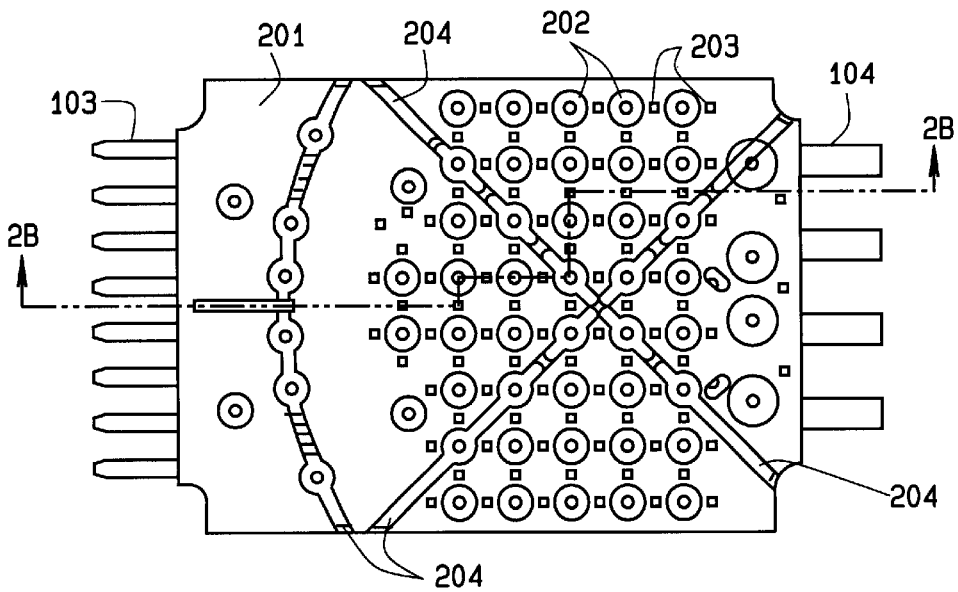
FIG. 2(a) is a top plan view of another embodiment of the present invention.
Figure 2B:
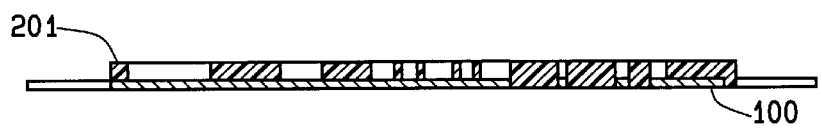
FIG. 2(b) is a cross-section view taken along lines 2(b)—2(b) of FIG. 2(a)
Figure 2C:
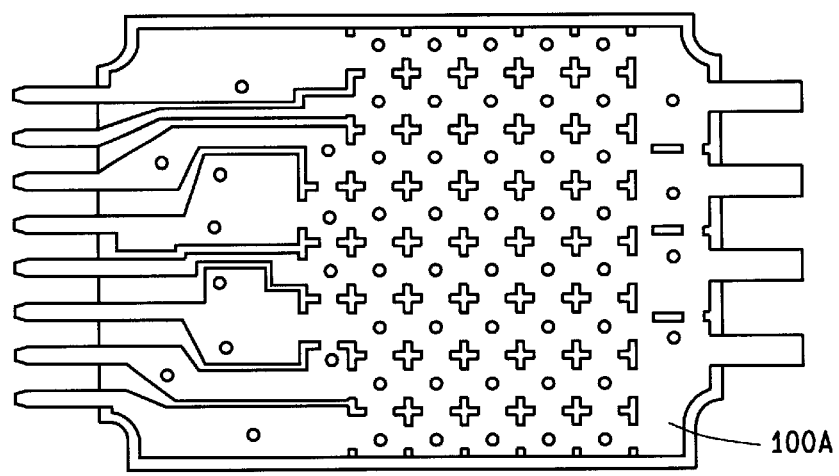
FIG. 2(c) is a bottom plan view of the conductive circuit plate of FIG. 2(a)
Figure 2D:
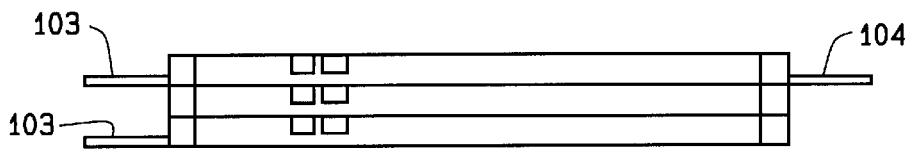
FIG. 2(d) is a side elevational view of another embodiment of the present invention.
Figure 2E:
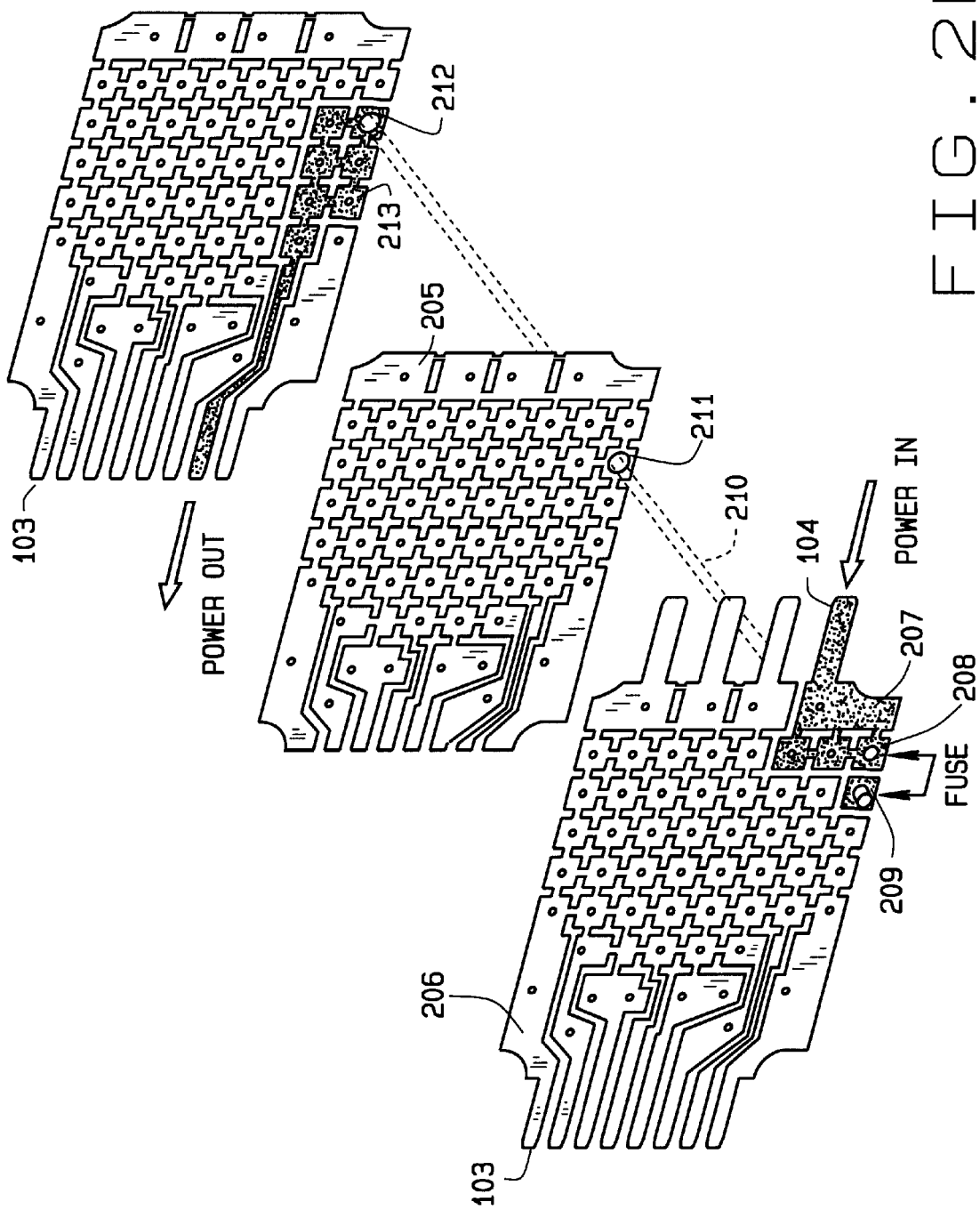
FIG. 2(e) is an enlarged view of the layout of the three conductive circuit plates used in FIG. 2(d)

We have developed a reliable, low-cost electric power distribution system which finds particular use in a vehicle. However, the invention described is not limited to vehicle applications and can be used for any operation which requires a power distribution panel capable of supporting a wide range electrical wiring architecture. We provide a conductive circuit plate that has a repeating pattern of openings and shaped cut-outs. The shaped cut-outs are arranged so that the material left surrounding the openings define electrical circuit paths extending from and interconnecting each opening. The desired circuit path is created by selectively electrically isolating openings and their surrounding material from other openings-and their surrounding material. Multiple circuit plates may be stacked to provide a desired distribution panel. An interconnection between the stacked circuit plates may be accomplished by using connective pins positioned in the openings to interconnect the circuits defined on successive circuit plates. The placement of the openings is such that they accommodate standard circuit elements i.e., fuses, relays, etc., which may be installed in the formed circuit paths. With the addition of these active circuit elements, a complete panel is capable of serving as the central processor for the entire vehicle. The invention can best be understood with reference to the accompanying drawing figures.

FIGS. 1(a) and 1(b) are top plan views of one example of a conductive circuit plate prepared according to the invention, and generally depicted by the numeral 100. Preferably, the conductive circuit plate is fabricated by stamping from a conductive metal sheet having a thickness of from about 0.5 to about 1.3 mm. Many different conductive materials of varied thicknesses would be acceptable, depending upon the intended use of the circuit plates. For vehicle uses, the preferred metal is copper. The conductive plate shown is stamped from 0.08 mm CDA 110 half hard copper. In a preferred embodiment, to facilitate subsequent soldering operations, the conductive circuit plate 100 is solder plated or coated to provide a solder layer thickness of about 0.005 to about 0.01 mm. The conductive material may be preplated or coated before the stamping operation, or a plating or coating may be added later. One of the preferred solder compositions for a copper base is a tin solder composition. Of course, other suitable compositions, known to those skilled in the applicable art, may be substituted for the solder just described.

A feature of the conductive circuit plate (100) is a plurality of interconnected first contact pads (101). The first contact pads (101) are formed by stamping a plurality of cut-outs (101c) between vertical center lines (101a) and horizontal center lines (101b). The vertical and horizontal portions of each cut-out (101c) are rectangular stampings. As shown, the cut-out (101c) is a Greek type cross as defined on page 309 of Webster's Ninth Collegiate Dictionary. The cut-outs (101c) are spaced in a predetermined pattern. In this instance, vertical center lines (101e) through the vertical legs of the crosses (101c) are parallel with the contact pad center lines (101a) and the horizontal cross center lines (101d) are parallel with the horizontal pad center lines (101b).

The conductive plate 100 has, as an option, a plurality of second contact pads (107) and third contact pads (108). The contact pads (101) are preferably all identical, and the second contact pads (107) are generally adjacent one end of the conductive plate. The contact pads (107), as shown, are not identical, but if desired they may be. The third contact pads (108) are generally adjacent the other end of the conductive plate. The contact pads (101) are arranged to provide a right angle grid pattern as shown in FIG. 1(b). That is, vertical groups of contact pads (101) have vertical center lines (101a) extending parallel to each other, and the horizontal groups of contact pads have horizontal center lines (101b) extending parallel to each other. The horizontal center lines (101b) intersect the vertical center lines (101a) at right angles. The vertical center lines (101a) are each equally spaced apart from each other, and preferably spaced apart to accommodate a minifuse, such as an ATM-style minifuse manufactured by the Bussmann Division of Cooper Industries.

The horizontal center lines (101*b*) are also each equally spaced apart from each other and preferably spaced apart to accommodate a minifuse as described above. Thus, both the vertical and horizontal contact pad center lines are spaced apart substantially the same distance. In the preferred embodiment, the contact pad center lines are spaced apart a distance of about 7.9 to about 8.1 mm.

Of course, the rectangular array arrangement of contact pads need not be strictly adhered to. It may be discovered that a triangular, hexagonal, circular, elliptical, or other combination of these arrangements of contact pads best serves a particular application. With a triangular or hexagonal array of contact pads, for example, the coordinate system formed by the contact pad center lines would no longer be rectangular in nature, but would form, in one instance, concentric triangles or hexagons. Centerline spacings would still be arranged to conform to the contact spacing of industry standard components.

For any array of contact pads, center-to-center spacing would be such to accommodate components with standard lead spacing (or an integral multiple of a standard spacing) in more than one direction, thus providing a great deal of component orientation flexibility.

The first contact pads (101) are shown as having a substantially square shape. However, the shape of the contact pads is best determined by the ultimate use of the circuit plates. Use may dictate that the contact pads be nonrectangular, triangular, circular, elliptical, or any desired shape as shown hereinafter. Generally, the circuit plate (100) has at least 9 first contact pads (101). Although the first contact pads (101) are depicted in the figure as having holes (106) of a uniform size therethrough, the contact pads could also be fabricated without openings, or with openings of varying dimensions. The second and third contact pads (107, 108) have irregular shapes that are used to hold various other components such as relays and other size fuses.

The contact pads (101, 107, 108) are shown electrically connected to selected other contact pads by integrally formed conductive traces (102). In the preferred embodiment, there are at least three conductive traces (102) for each pad (101). These conductive traces (102) are formed by the stamping die used for conductive circuit plate fabrication, although other methods of forming these traces are not precluded, and will occur to those of skill in this fabrication art. Both the conductive circuit plate and the conductive traces could be fabricated by using an etching process, for example. In application, some of these conductive traces (102) are removed by a subsequent operation to ensure that electrical connection is made only between selected ones of the contact pads (101, 107, 108), as discussed in greater detail hereinafter.

The conductive circuit plate (100) also includes a plurality of first connector electrical contacts (103) at one end of the circuit plate, and a plurality of second electrical contacts (104) at the other end of the circuit plate. The electrical contacts (103, 104) are integrally formed during fabrication, and are coplanar with and extend outwardly from the conductive circuit plate main body section. FIG. 1 shows these contacts (103, 104) as joined at a point distal from the main body of the conductive circuit plate by bars of material (105, 109). The contacts are formed in this way during the fabrication process to keep the contacts from being bent or otherwise damaged. The bars of material (105, 109) can be removed by a cutting operation at a later stage of manufacture. In the alternative, of course, the bars of material (105, 109) need not be used at all.

Another feature is that openings or holes (110) in the second and third contact pads (107, 108) are not centered on these pads and are located to facilitate electrical connection to the conductive circuit plate in different arrangements than rectangular array of contact pads described above. The mounting holes (110) are provided with varied spacings to accommodate electrical connection to electrical components of different sizes, and different mounting or socketing arrangements.

FIGS. 2(*a*)–2(*c*) illustrate yet other features of the present invention. These depict an insulated conductive circuit plate having a conductive circuit plate (100*a*) without the bars (105, 109), and at least partially coated or attached thereto with a nonelectrical conductive material (201). In the preferred embodiment, this is an electrically insulating material such as Rynite FR530, 94V-0, manufactured by E.I. DuPont Company and described as a PET (polyethylene terephthalates) thermoplastic polyester, but any of a number of insulating plastic or other materials would serve in this application, as is well-known in the art. Preferably, the spacing or insulating material can be applied using an injection molding process, wherein the conductive circuit plate (100, 100A) is supported by pins or other supporting structure within the mold, and mold inserts determine the areas where the insulating material (201) is prevented from flowing. As a general statement, it can be said that the conductive circuit plate (100*a*) is at least partially covered or coated by the insulating material, with the exception of areas (202) near the central portions of the contact pads (101) and which surrounds the openings (106, 110), areas (203) over the conductive traces (102) that interconnect selected contact pads (101), and areas (204) as noted. These areas are kept clear of the insulating material so that the traces (102) may be easily removed and portions of the contacts removed. Also shown in FIG. 2(*a*) are the electrical contacts (103, 104), now freed from the restraining bars of material (105, 109) illustrated in FIG. 1. It should be noted that the material from which the conductive circuit plate is fabricated permits a rotation or bending of the electrical contacts (103, 104), so that the plane of one or more of the electrical contacts (103) may be made perpendicular to the plane of the conductive layer itself. Although not shown in the figure, this ability to change the plane in which one or more of the electrical contacts is oriented adds greater flexibility in terms of interconnection with external power distribution networks, which may include electrical connectors and attached electrical wires.

FIG. 2(*b*) illustrates the relative thickness of the insulating material (201). As shown in the figure, the insulating material (201) extends outward from one surface of the conductive circuit plate only, although this application technique need not be strictly adhered to for proper assembly. The distance the material extends is determined by the desired spacing between two adjacent plates 104. FIG. 2(*b*) shows the vacated areas of the circuit plate, some of which are described above, where insulating material is not permitted to flow.

FIG. 2(*c*) is a bottom plan view of the coated conductive circuit plate showing the circuit plate (100*a*) after the electrically insulating material (201) has been applied. As noted above, in this embodiment, the electrical insulating material is applied principally to only one side of the conductive circuit plate (100*a*). However, as has also been noted, this design practice need not be strictly adhered to for the invention to function properly.

FIG. 2(*d*) shows a side schematic of three insulated conductive circuit plates stacked vertically, one on top of another, with electrical contacts (103, 104) extending outwardly therefrom. In this embodiment, the middle or second insulated circuit plate has had the contacts (103, 104) removed prior to being assembled, and the bottom or third circuit plate has had one set of contacts (104) removed. Depending upon the ultimate use, selected contacts from the groups (103, 104) of conductors on each circuit plate may be removed.

The insulating material that adheres to each of the conductive circuit plates prevents unwanted electrical contact between different conductive circuit plates. The insulating material also serves another purpose. The insulating layers also provide equal spacing for the conductive plates, and help maintain the conductive plates in a substantially parallel relationship.

As mentioned above, with reference to FIG. 2(*a*), the insulating material is preferably kept away form certain areas, namely, the areas around the central porions of the contact pads, and the areas around the integrally formed conductive traces. This is because a subsequent operation serves to selectively remove the integrally formed conductive traces between selected contact pads where electrical contact is not desired. Of course, the conductive traces need not be removed completely, but may simply be severed on one end and bent out of the plane of the circuit plate to avoid electrical contact. Coating or encapsulating the conductive circuit plate in the manner described acts to hold the conductive circuit plate together, even if it should become necessary to completely sever the electrical and physical connections between selected portions of the layer and the main body of the layer. Although it is not shown in the figure, the stamping operation that is used to form the conductive circuit plate can be constructed in such a way that it "kicks" portions of the conductive layer, such as the corners of the contact pads, out of the plane of the remainder of the conductive layer, so that these "kicked out" portions may be embedded more securely in the insulating material, thus forming a stronger structure. Further, as will be discussed in more detail below, the openings previously described in the contact pads may require enlarging to conform to the inventive assembly process, and will also require soldering to ensure good electrical contact with selected other conductive layers. This is specifically why the central portions of the contact pads are left free of insulating material.

FIG. 2(*e*) illustrates how a conductive path is formed within the apparatus. Three different conductive circuit plates (204, 206) are shown in the figure. One of the significant economies of the inventive apparatus is the fact that the conductive circuit plates are substantially identical prior to the shearing operation that removes or disconnects selected conductive traces. A single stamping tool is used to fabricate the conductive circuit plates, and a single mold-in-place operation coats or encapsulates the conductive circuit plates. It is not until the shearing operation that removes or disconnects selected conductive traces and/or enlarges selected contact pad openings, that each conductive circuit plate begins to assume a unique identity.

The conductive circuit plates (204, 206) of FIG. 2(*e*) would be, in the preferred embodiment, first coated with a solder composition and then coated or encapsulated with insulating material prior to the shearing operation that defines specific conductive paths, but, for the sake of clarity, the solder coating and insulating material is not shown. Power may be applied to an upper conductive circuit plate (206) through an electrical contact (104). Note that conductive traces that originally connected adjacent contact pads around the periphery of the shaded area (207) of the upper conductive circuit plate (206) have been removed by a shearing operation, so that the shaded area (207) is electrically isolated from the surrounding region. The conductive path leads to a first contact pad (208), to which an electrical connector (not shown) would ordinarily be affixed to accommodate one terminal of a fuse, as indicated. A second adjacent contact pad (209) has also been electrically isolated from the remainder of the shaded region (207), so that another electrical connector may be provided to contact the remaining terminal of the fuse. Of course, electrical connectors are generally provided as a part of a conductive pin penetrating the conductive layers. For the sake of clarity, only one of the conductive pins (210) is shown, and much of its length is indicated in dashed lines, since the length has been exaggerated to present a clear view of the conductive circuit plates (204, 206). The conductive path extends through the first contact pad (207), through the fuse, to the second contact pad (209).

At this point, the conductive pin (210) makes electrical contact with the contact pad (209), and extends the conductive path in the direction of a second conductive circuit plate (205). For this particular conductive path, the second conductive circuit plate (205) is not involved, so the opening in the contact pad (211) through which the conductive pin (210) traverses has been enlarged so that the pin (210) does not make electrical contact at this point. Note also that the second conductive circuit plate (205) has had both sets of electrical contacts (103, 104) removed by a shearing operation, since these contacts are not needed in this example.

The conductive path continues via the conductive pin (210) to a bottom conductive circuit plate (204), where the pin makes electrical contact with the contact pad (212) through which it passes. The shaded area (213) of the bottom conductive circuit plate (204) has been electrically isolated from the surrounding portions by removal of the conductive traces that originally connected adjacent contact pads around the periphery of the shaded area (213). The conductive path continues to an electrical contact (103) extending outwardly from the conductive circuit plate, through which power may now be distributed via an external distribution network that connects to the electrical contact (103) via a mating connector and cable assembly (not shown).

FIG. 2(*f*) is an alternative representation of a conductive circuit layout. Power is applied to an electrical contact (104) on an upper circuit plate (206), where it is distributed to a middle plate (205) by the conductive pin arrangement described above (all pins not shown, for the sake of clarity). From a contact pad on the middle plate (205), power is distributed over the contact pads shown in the shaded area (220), where power is fed back to the top layer (206) through a set of contact pads (226 and 221) connected by a conductive pin (not shown). A fuse or other suitably spaced component can then be placed between contact pads (221 and 227), using the electrical terminals in which the pins terminate, as described above, with output power proceeding to one of the electrical contacts (223) at the edge of the top circuit plate (206). Power is also fed through to the top circuit plate from contact (229) to contact (222), where it is applied to a relay package (224) which is shown schematically. When a control signal (electrical ground) is applied to the appropriate relay contact through the input electrical connector (225), the relay energizes, and the output voltage appears at the appropriate output contact (228) on the top plate (206).

Whenever the electrical path changes from one circuit plate to another, it must do so through a conductive pin.

Figure 2F:
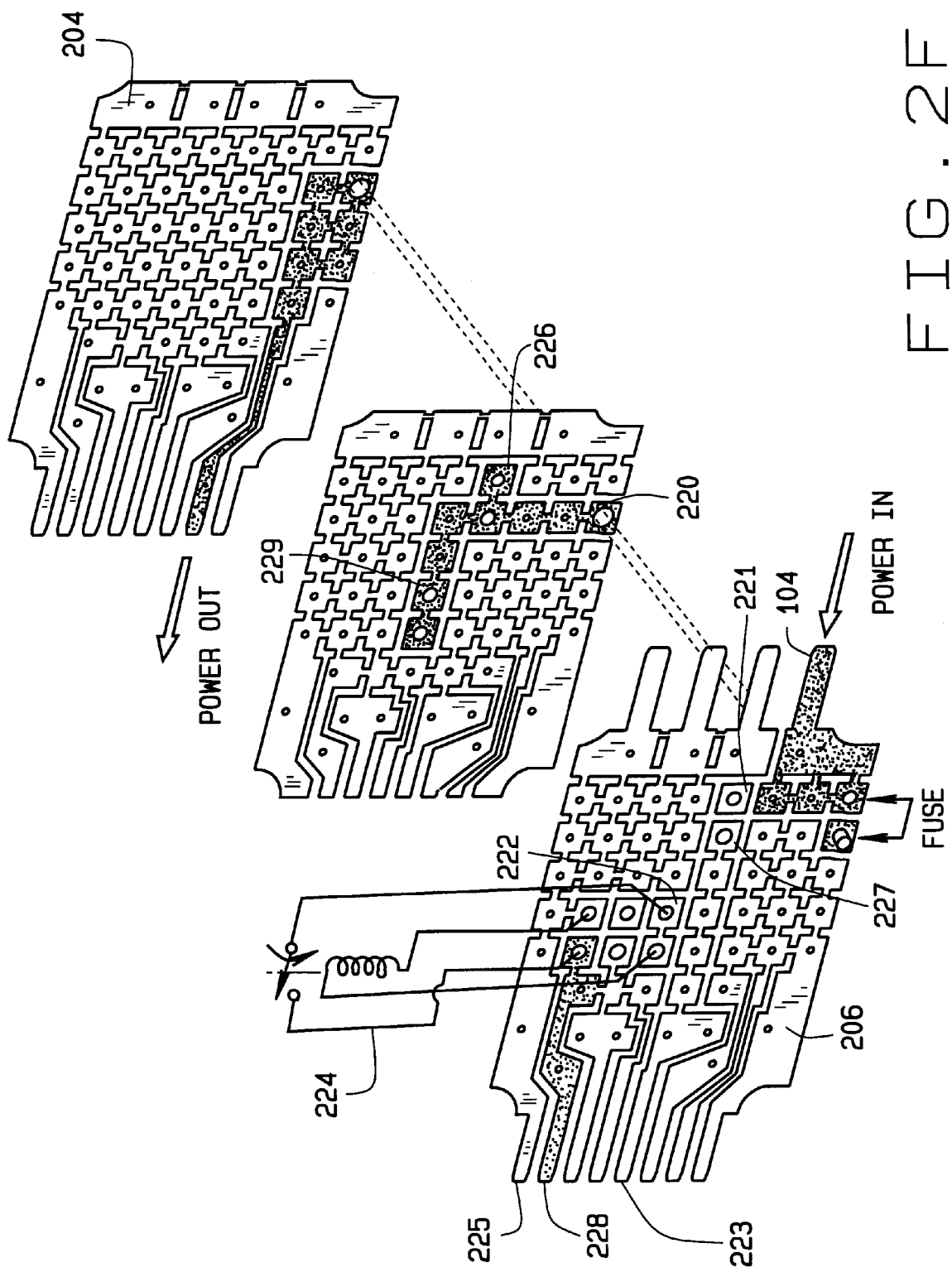
FIG. 2(f) illustrates yet another layout of the three conductive circuit plates used in FIG. 2(d)

Even though all of the conductive pins in FIG. 2f are not shown, for the sake of clarity, a conductive pin must make electrical contact with pads (222 and 229) in order to complete the desired circuit path. Similarly, a conductive pin must penetrate pads (221 and 226) in order to bring the power input circuit back to the top plate (206). Of course, conductive pins ordinarily penetrate all of the circuit layers, and openings in the contact pads through which the conductive pins penetrate must be enlarged to avoid pin contact where no contact is desired, even though this is not shown in FIG. 2f in every instance where such opening enlargement is desirable.

Figure 3A:
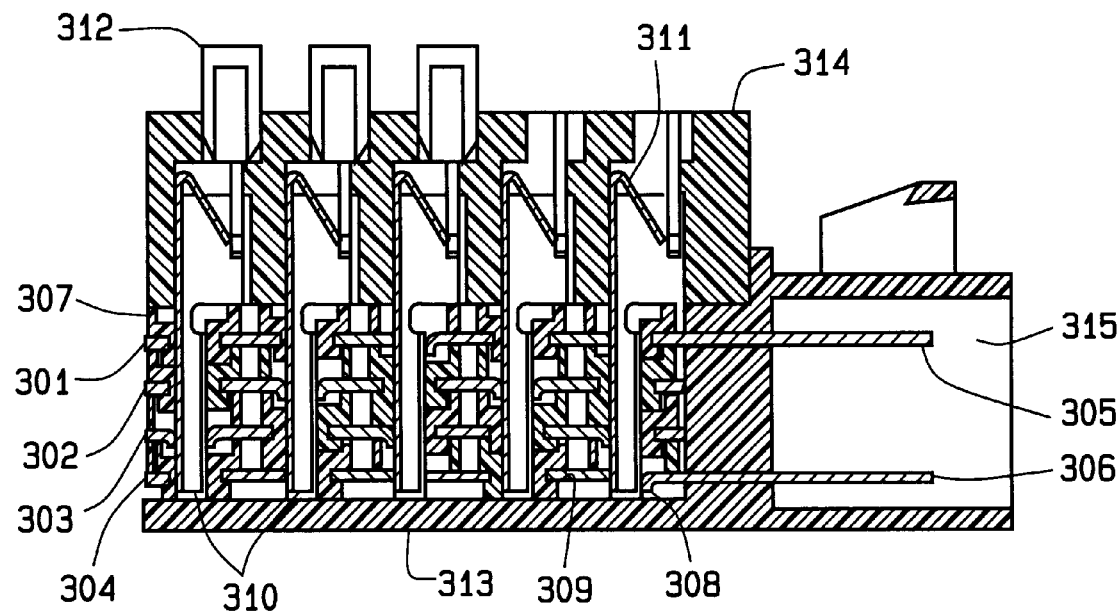
FIG. 3(a) is a side section view of vertically stacked conductive circuit plates in a housing.

The assembly views of FIGS. 3(a) and (b) further serve to illustrate a complete assembly of conductive circuit plates. In FIG. 3(a), four conductive circuit plates (301–304), complete with associated insulating material (307, for example), are stacked vertically, with a plurality of conductive pins or connectors (310) providing electrical contact between selected contact pads of different selected conductive circuit plates. Some of the openings (such as 309) previously described in the central portions of the contact pads are made substantially larger than the outside diameter of the conductive pins (310), so that no electrical contact will be made with the associated pin. Other openings (308) are actually extruded slightly, as shown, so that the pin is an interference fit in the opening, and good mechanical contact, as well as electrical contact, can be made between contact pad and pin. After the pins are inserted through the openings in the contact pads, they may be soldered to each pad with which they come into contact.

Selected conductive pins can be provided with electrical connectors on at least one end. In FIG. 3(a), each of the pins (310) is shown with an electrical connector (311) at one end. The electrical connector (311) shown in this view is integrally formed as a part of the pin, but the connector could be formed in alternative ways (to be discussed below). Various electrical components (312), fuses in this illustration, are shown mounted so that the components (312) make electrical contact with the electrical connectors (311). It should be noted that the inventive distribution apparatus is designed to accommodate various electrical components used in vehicle electric power distribution systems, including, but not limited to: maxi-fuses or circuit breakers, mini-relays, micro-relays, and minifuses or circuit breakers. All of these component types are well-known in the automotive arts. In addition, since various component spacings are accommodated by the arrangement of contact pads on the conductive circuit plates, and because various designs of pins and associated electrical connectors are contemplated by the invention, virtually any automotive electrical component that might be a useful part of such an electric power distribution system, whether extant or yet to be developed, can be accommodated.

FIG. 3(a) also shows a housing, in this view composed of a bottom portion (313) and a top portion (314), that substantially surrounds the vertically stacked conductive circuit plates. The housing shown is manufactured of thermoplastic polyester, 30% glass filled. Of course, other housing geometries and materials are possible. The housing (313, 314) includes an opening (315) designed to accommodate connection with an external electrical power distribution network. In this case, the opening (315) is designed to accommodate a connector housing (not shown) containing electrical connectors designed to mate with electrical contacts (305, 306) integrally formed with the conductive circuit plates. The connector housing may include a wiring harness for routing of input or output power.

Figure 3B:
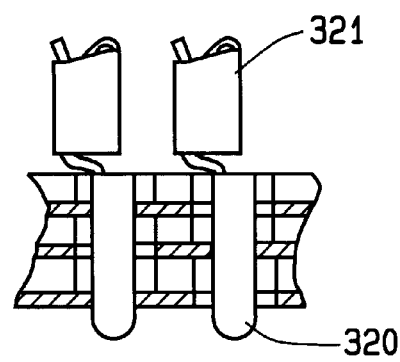
FIG. 3(b) is a stylized sectional depiction of conductive pins penetrating the conductive circuit plates.

FIG. 3(b) is a somewhat stylized representation of conductive pins in an alternative arrangement. Each pin (320) has a terminal spring or cap (321) that is separately manufactured, and is attached to the elongated pin portion (320) by mechanical means (such as a snap-fit), or by brazing, soldering, or similar well-known technique.

FIGS. 4 and 5 show the details of the multiple-piece conductive pin design.

Figure 4A:
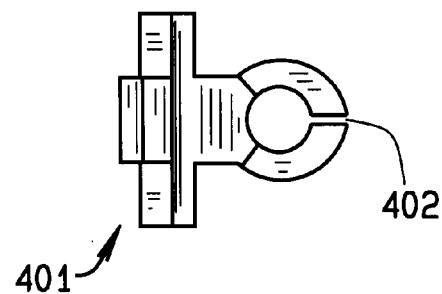
FIGS. 4(a)–(c) are top, side, and rear views, respectively, of a pin terminal suitable for use with the present invention.
Figures 4B, 4C:
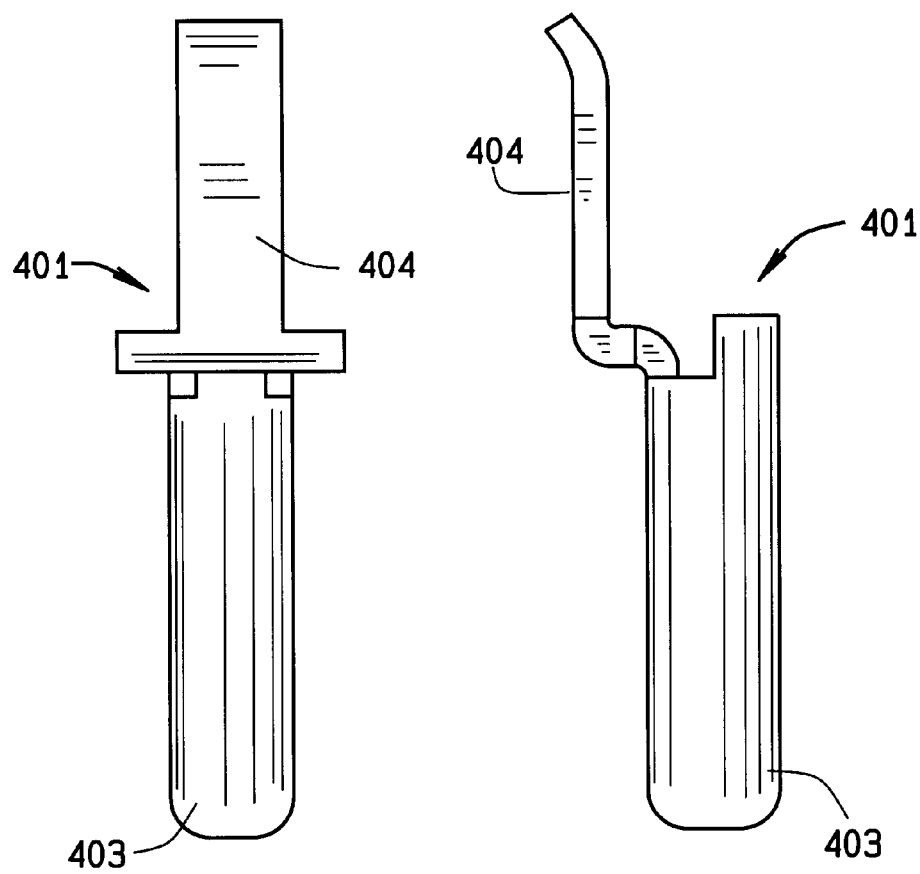

FIG. 4(a) is a top view of the pin terminal (401), in which details of its construction can be seen. The tubular lower portion (403) of the pin terminal is formed by a stamping operation that causes the material of the lower portion to be rolled into a nearly circular cross section, thus leaving a longitudinal slot (402) extending throughout the entire length of the lower body (403) of the pin (401). The extreme lower portion is also slightly rounded by the forming operation, leaving a hole in the pin, at the bottom, that is slightly smaller than the inside diameter of the rolled structure. FIGS. 4(b) and (c) are side and rear elevational views, respectively, showing the geometry of the upper portion (404) of the pin (401). Preferably, the pin terminal (401) is fabricated from 0.7 ±0.07 mm CDA 110 half hard copper, with 0.005 to 0.01 mm inch solder plate (which may be preplated stock). Of course, the foregoing discussion should not be interpreted to preclude the use of other materials and geometries.

Figure 5A:
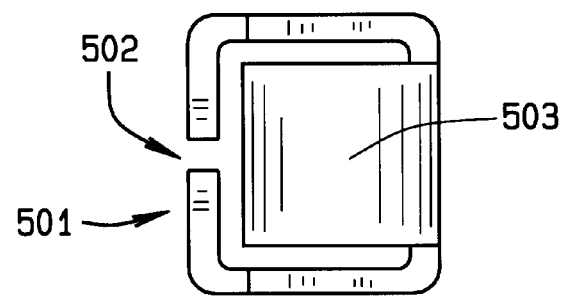
FIGS. 5(a)–(c) are top, side, and front views of a terminal spring suitable for use with the pin terminal of FIG. 4.
Figure 5C:
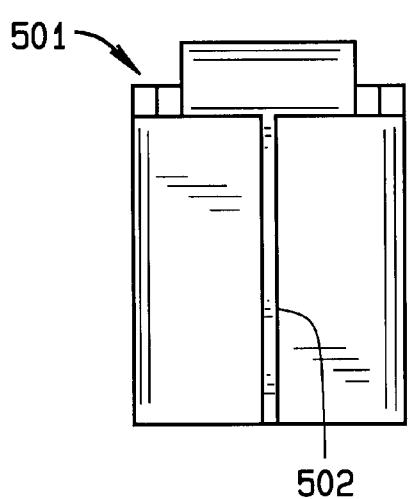
Figure 5B:
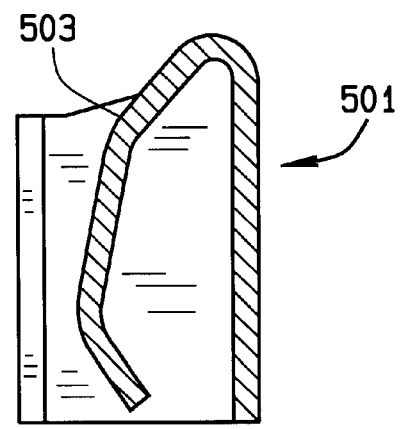

FIG. 5 shows details of construction of a terminal spring designed to operate in conjunction with the pin terminal just described. The terminal spring fits snugly on the pin terminal to provide a secure mechanical and electrical connection. Preferably, the terminal spring (501) is constructed of stainless steel, so that the integrally formed spring member (503) will provide the requisite contact force to mating electrical connectors. Because of the method of its fabrication, the terminal spring also includes a slot (502) extending longitudinally over its full length. FIG. 5(a) is a top view, while FIG. 5(b) is a side section view and FIG. 5(c) is a front view of the terminal spring.

Figure 6:
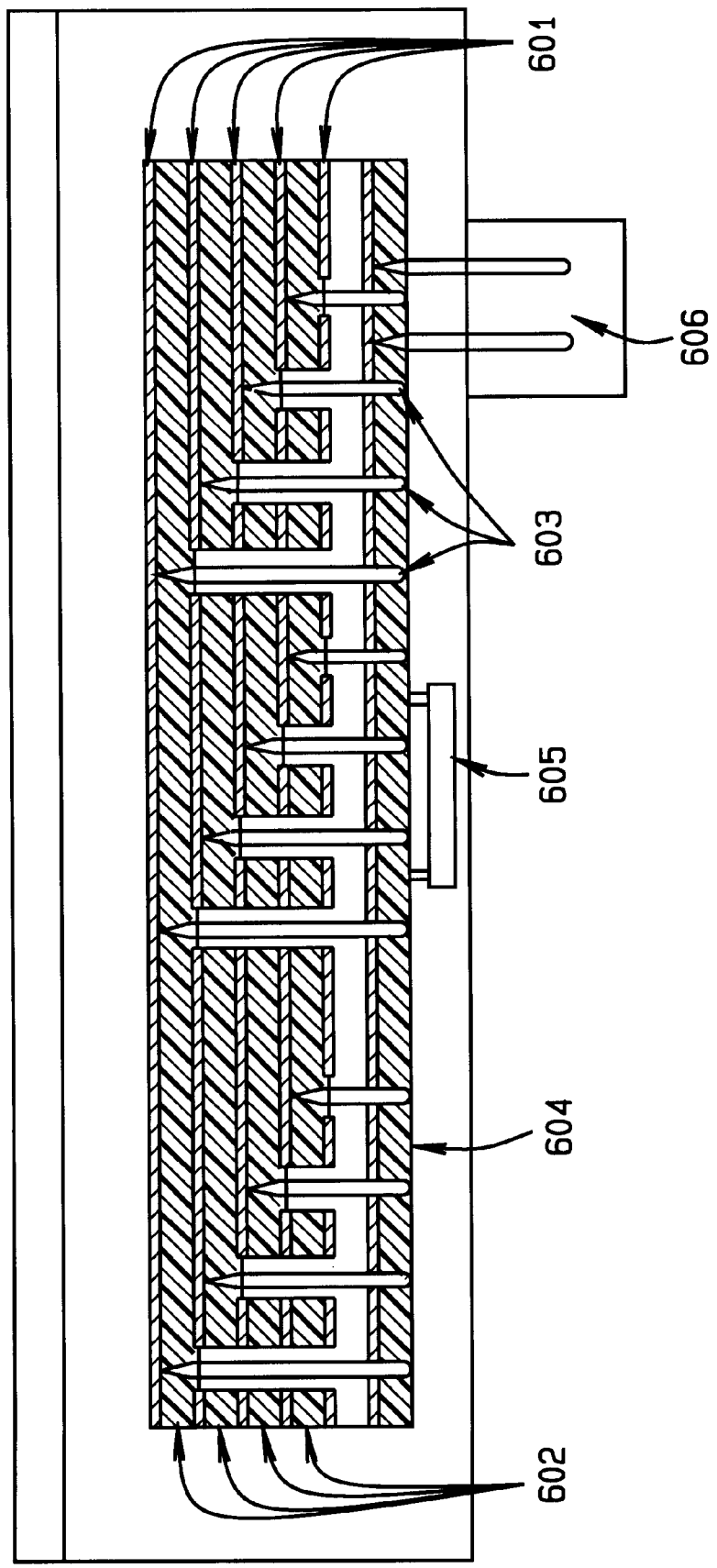
FIG. 6 is a stylized section view of an electric power distribution apparatus showing interconnection with a circuit board.

Yet another inventive feature is illustrated in FIG. 6, a somewhat stylized depiction of the electric power distribution apparatus. The distribution apparatus illustrated shows five conductive circuit plates (601) separated by layers of insulating material (602), with conductive pins (603) providing electrical contact between selected contact pads of different selected conductive circuit plates. This embodiment illustrates that some of the conductive pins (603) terminate before penetrating all conductive layers, in contrast to what has been shown and described with reference to the other pertinent drawing figures. Also attached to the conductive pins is a printed circuit board (604) of conventional design. The printed circuit board (604), in addition to supporting electronic components (605), such as integrated circuits, resistors, capacitors, etc., may also include one or more connectors (606) for providing power or other electronic signal input and output. Thus, the electric power distribution described herein can easily be interfaced with a range of electronic components, and the entire assembly can be placed in a housing, creating a rugged electronic module for vehicle installation that can support data logging, digital electronic control features, etc.

In another embodiment of the invention, the overall form factor of the conductive circuit plate is slightly modified, and the shape of the conductive pads is altered. These features are illustrated in FIGS. 7(a) and (b).

Figure 7A:
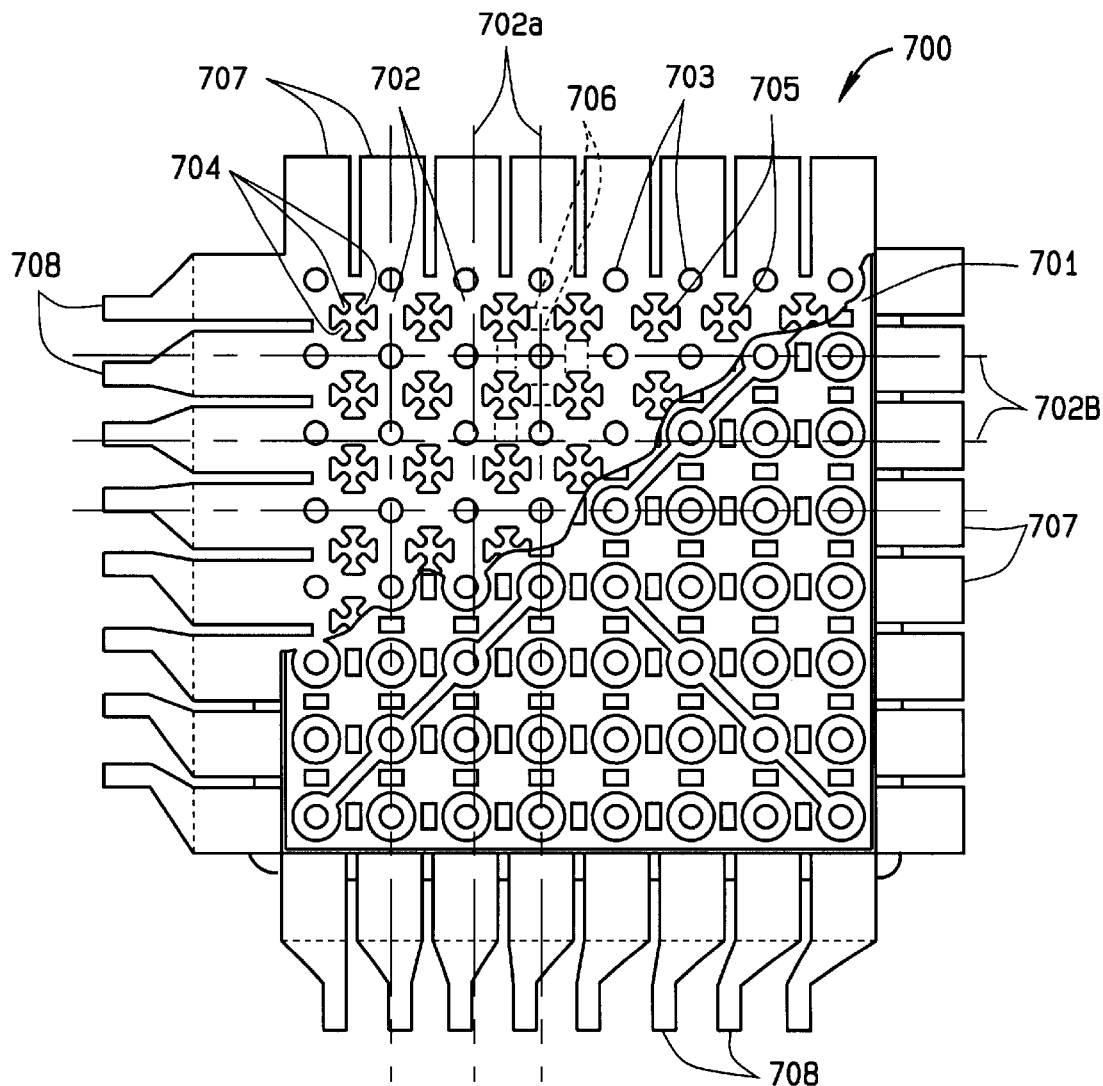
FIG. 7(a) is an enlarged plan view of an alternative embodiment of a conductive plate in accordance with the present invention, with a portion of an insulating layer cut away.

FIG. 7(a) is a top view of a conductive circuit plate, generally depicted by the numeral (700). The circuit plate (700) is coated or plated with a thin solder coating. One surface of the solder coated plate (700) has molded or coated thereon preferably an electrically insulating layer (701). Insulating layer (701) at least partially covers the surface of the conductive circuit plate (700), in much the same manner as described above with reference to the conductive circuit plate (100) and insulation (201). For the sake of clarity, the electrically insulating material (701) has been cut away in this view, to reveal details of conductive circuit plate fabrication. It should be noted that the specific electrical insulation properties of this insulating material are not critical, since the insulating material is present primarily to provide an interlock for vertical stacking, which will be described in detail below, and to provide spacing of contacts for alignment with external connectors. Of course, the insulating material does space apart the circuit layers as well, as described above.

The conductive plate is still a generally rectangular grid arrangement of vertical center lines (702a) and horizontal center lines (702b). The contact pads (702) have openings or extrusions (703) through the center of the contact pads (702). However, the contact pads (702) do not have the distinctly square form factor identifiable in the previously described embodiment. The contact pads (702) are formed by stamping a plurality of cut-outs (705) wherein the vertical and horizontal legs have flared ends. These provide the contact pads (702) with a plurality of narrow attachment or gripping tabs (704). The specific purpose of the narrow gripping tabs (704) will be treated in detail below.

The cut-outs (705) have a shape generally described in Webster's Ninth New Collegiate Dictionary, page 309, as a formée cross whereas cut-outs (101c) of FIG. 1(b) is described as a Greek cross. Of course, the cross of the present invention has also been described as being similar to a four leaf clover in that it has rounded edges rather than the pointed edges of the formée cross. The cut-outs (705) are spaced in a predetermined pattern. In this instance, vertical center lines (702e) through the vertical legs of the crosses (702) are parallel with the contact pad center lines (702a) and the horizontal cross center lines (702d) are parallel with the horizontal pad center lines (702b).

Integrally formed conductive traces (706) are shown in dotted lines on FIG. 7(a) for illustrative purposes on only some of the conductive pads (702). As shown, all of the conductive pads have interconnecting traces (706) which extend between the wide ends of each stamped cut out (705). As illustrated in FIG. 7(a), the conductive pads are generally square with the gripping tabs (704) extending from each corner. The conductive traces (706) of this embodiment are noticeably wider than the conductive traces (102) of FIG. 1. The conductive traces (706) have enhanced current-carrying capability.

In a fashion similar to that described above, the conductive circuit plates (700) in accordance with the present invention are preferably identically formed from a single stamping die, and are provided with an electrically insulating material in a single mold. This initial uniformity of the conductive layer (700) is a major factor in the overall economy of the inventive approach to vehicle power distribution.

Figure 7B:
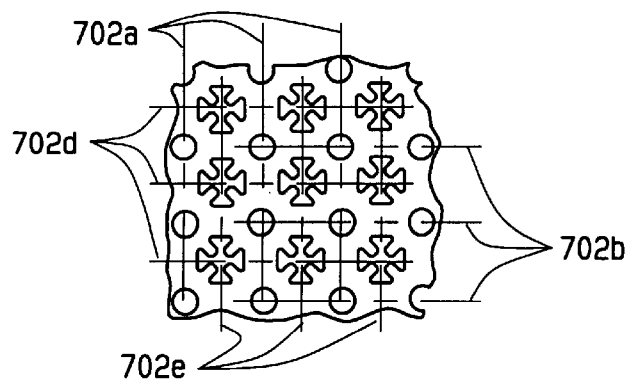
FIG. 7(b) is a partial enlarged plan view taken along line 7b of FIG. 7(a)

As noted with reference to the previously described embodiment, the stamping operation that forms the basic conductive layer can "kick out" the corners of the contact pads so that these corners can be embedded in the encapsulating plastic, thus forming a stronger overall structure. In the embodiment of FIG. 7, the narrow tabs of material (704) may be kicked out in the stamping operation. These tabs of material (704) extend outwardly from the conductive circuit plate (700) a greater distance than the kicked out corners of the rectangular contact pads of the prior embodiment. The kicked out tabs provide a strong attachment structure for the insulating material that is molded on the one surface.

As was the case with the prior embodiment, the electrically insulating material (701) is deliberately kept away from certain areas of the conductive circuit plate (700) in order not to interfere with subsequent operations. In particular, the insulating material is not allowed to form near the openings or extrusions (703) in the conductive pads, nor around the conductive traces (706). Since selected ones of the openings or extrusions (703) may require enlargement to avoid contact with conductive pins (described in more detail below), and the shearing tool must be able to make contact with the conductive traces (705) to be removed, the insulating material is kept clear of these areas.

To form the desired interconnection among selected contact pads (702), selected conductive traces (706) are removed, i.e., are sheared, subsequent to the application of the electrically insulating material (701). One advantage of this lack of insulating material in the immediate vicinity of the conductive traces (706) is that the conductive traces that have been removed or sheared can be identified by visual inspection.

Figure 10:
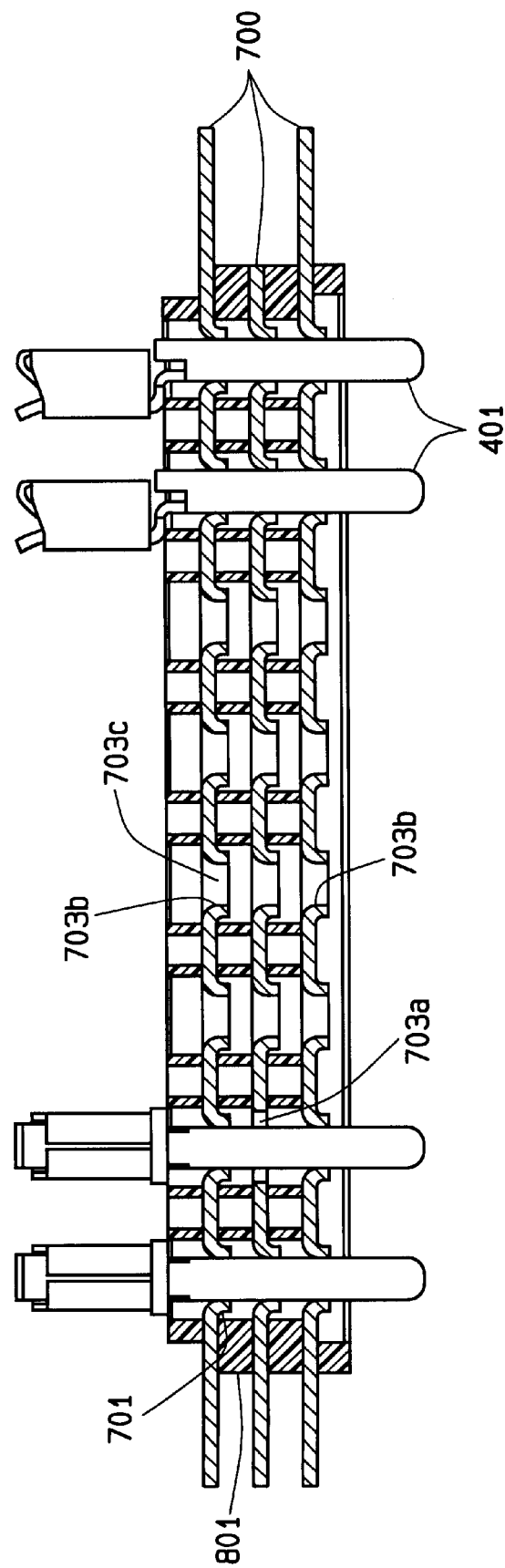
FIG. 10 is a side section view illustrating the conductive plates of the alternative embodiment in a vertically stacked configuration.

As a part of the removing or shearing operation, or, in the alternative, in another subsequent operation, openings or extrusions (703) in the contact pads with which electrical contact is not desired are enlarged as openings (703a, FIG. 10). Since the outer surfaces of the circuit plate (700) are solder coated, the inner surface (703c) of the extrusion is solder coated. Thus, the extrusion (703) provides a relatively large surface area (703c) to electrically contact the pins (401). Also, the soldering of the pins (401) to the extrusion (703) is relatively accurate and quick, especially when both the pins (401) and the extrusion surface (703c) have solder coatings thereon. The extrusion surface (703c) provides a press fit for the pins (401) and holds them in place before and after the pins (401) are soldered to the contact plate extrusions (703). The extrusion operation may be combined with the shearing and enlargement operations as well, or the extrusion can be accomplished as part of a separate process.

Because of the solder coating of both the conductive plates and the conductive pins used to complete electrical connection between layers, the assembly can be adequately soldered simply by heating, such as in a solder reflow process. Consequently, a standard reflow oven can be used to effect the soldering operation and/or the pins can be heated to cause solder reflow.

FIG. 7 also serves to illustrate the deployment of integrally formed extended electrical contacts (708) extending outwardly from the conductive circuit plate (700) and coplanar therewith. In this embodiment, two adjacent sides have fully formed extended electrical contacts (708) extending outwardly therefrom, while the remaining two adjacent sides have truncated contacts (707) extending outwardly. Although the extended contacts (708) are integral with the circuit plate (700) they may be separate and connected to the circuit plate (700) via mechanical electrical connection such as a rivet, welding, or mechanical interference fit via a punch and die operation. Since these component parts are solder coated prior to attachment, heating of the assembly melts the solder internal to these connections, aiding in proper electrical attachment.

All the circuit plates could be formed with four sided truncated contacts (707). The contacts (708) could then be welded, brazed, riveted or mechanically attached to those truncated contacts (707) as desired and prior to assembling the circuit plates (700) for the desired application. Thus, a number of different size connector or extended contacts can be used with the same stamped circuit plate. These configurations of the conductive circuit plate represent the basic building blocks for expanded configurations to be described below.

Figure 8:
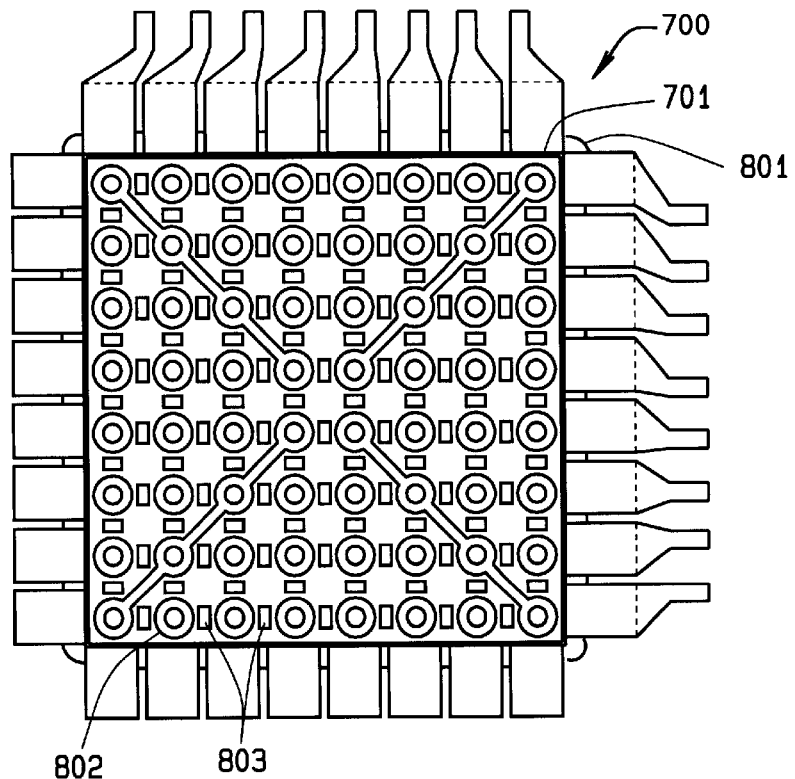
FIG. 8 is a top plan view of a conductive plate in accordance with the present invention.

FIG. 8 is a top plan view of the conductive circuit plate (700) illustrating a layer of molded electrically insulating material (701) on one surface of the circuit plate (700). It will be noted from this view of the insulated circuit plate (700) that there are regions (802) in the layer (701) immediately surrounding and exposing the openings (703) in the contact pads that are not covered with the electrically insulating material. In addition, regions (803) in the layer (701) immediately above and exposing the conductive traces interconnecting selected contact pads are also preferably not covered with the electrically insulating material. A raised seat portion (801) of the integral molded electrically insulating material adhering to the other surface of the circuit plate is also visible in this view, and shown in more detail in FIG. 9.

Figure 9:
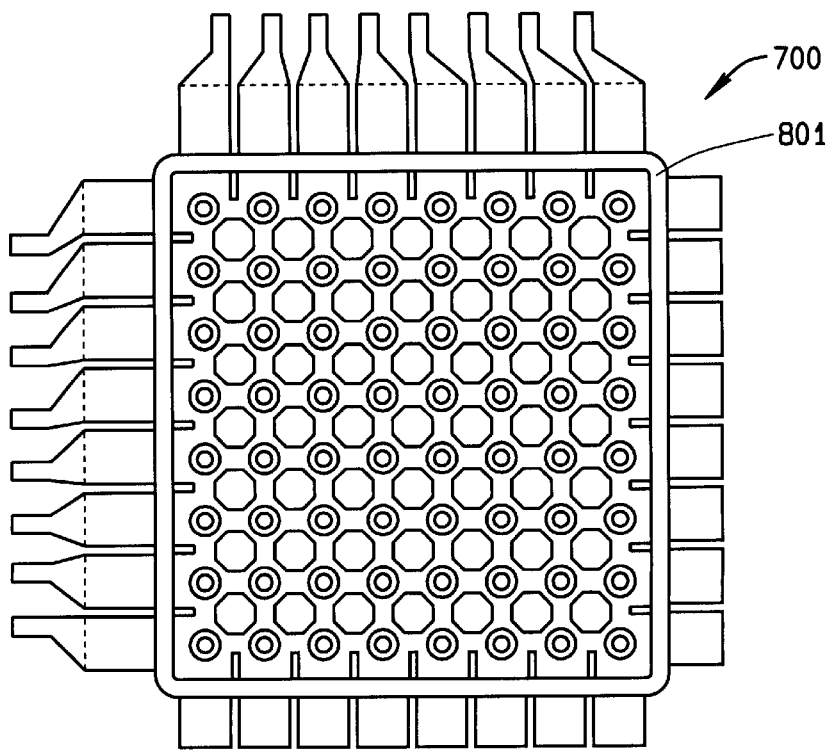
FIG. 9 is a bottom plan view of the conductive plate of FIG. 8.

FIG. 9 is a bottom plan view of the encapsulated circuit plate (700) illustrating yet another feature not incorporated in the circuit plate of FIG. 1. The seat (801) is a parametric ridge of electrically insulating material formed on the other surface of the conductive circuit plate (700). As will be noted from a comparison of the views of FIGS. 8 and 9, this parametric ridge (801) has interior dimensions that are the same or slightly exceed the exterior dimensions of the insulating material layer (701) on the upper surface. Thus, when electrically conductive plates (700) are stacked vertically, the parametric ridge (801) of one plate (700) closely surrounds the perimeter of the insulating material (701) on the mating conductive plate in an interlocking manner, thus ensuring proper lateral alignment of mating vertically stacked plates (700), while providing electrical insulation and appropriate spacing between plates.

FIG. 10 is a side section view of three vertically stacked conductive circuit plates (700). The interlocking aspect of the electrically insulating layers can also be appreciated from this view, as the parametric ridge (801) on the bottom surface of one circuit plate (700) surrounds and interlocks with the electrically insulating layer (701) of the conductive circuit plate (700) immediately below it. The edges of the parametric ridge (801) are chamfered slightly, as illustrated, to ease alignment for stacking purposes. Also, if desired, the outer perimeter of the insulation (701) may be chamfered to permit easy insertion into the ridge (801).

Conductive pins 401, whose construction has previously been described, are shown penetrating the stacked conductive layers (700) through the extrusions (703) in the contact pads. Electrical contact is enhanced by providing the contact area greater than that of just an opening.

Figure 11:
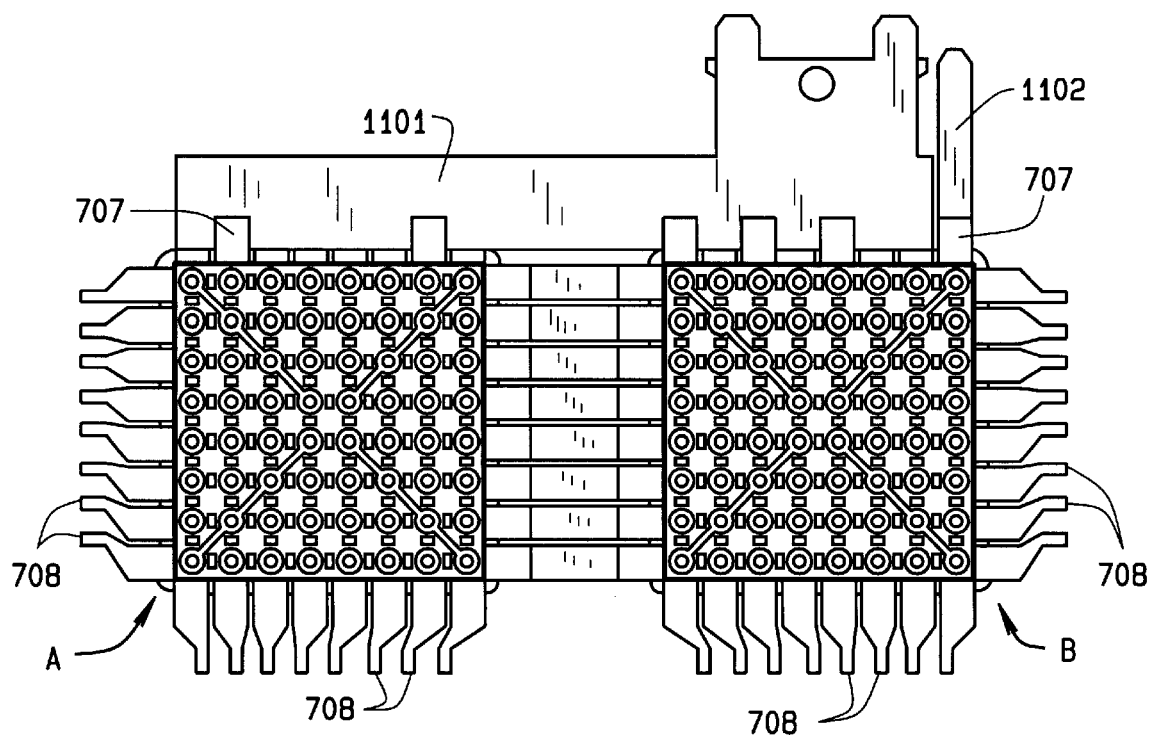
FIG. 11 is a top plan view of another feature of the present invention depicting the conductive plates in a stacked side-by-side configuration with conductive extender portions and conductive bridges.

Yet another aspect of the invention is illustrated in FIG. 11, which is a top plan view of a side-by-side arrangement of stacked conductive circuit plates configured as a power distribution module for use in a vehicle. The adjacent, coplanar conductive circuit plates of sides A and B are arranged in mirror-image symmetry. The adjacent sides containing the extended or connector electrical contacts (708) are oriented toward the left and bottom edges on side A, while the fully extended contacts (708) appear on the right and bottom edges on side B.

Additional electrical contact extender portions (1101, 1102) are shown electrically connected to selected ones of the truncated contacts (707) disposed along the top edge of sides A and B. These contact extender portions (1001, 1002) may be fabricated from the same material as the conductive circuit plates themselves, that is, 0.08 mm CDA 110 half hard copper, although other suitable conductive materials may also suffice. These electrical contact extender portions (1101, 1102) are attached to the truncated contacts (707) both electrically and mechanically, through brazing, riveting, or soldering, for example, or a combination of these, in order to ensure both electrical contact and adequate structural integrity. The remaining truncated electrical contacts that are not selected for connection to electrical contact extender portions may be truncated even further, flush with the perimeter of the electrically insulating encapsulating layer, for example.

Figure 12:
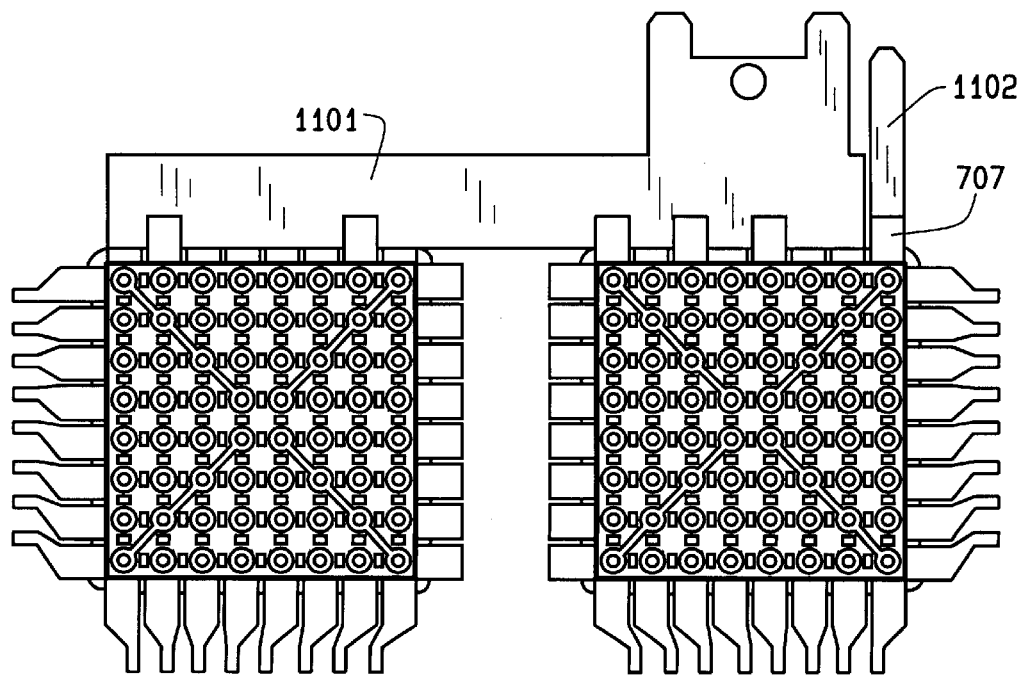
FIG. 12 is a top plan view of the top layer of the stacked configuration of FIG. 11.
Figure 13:
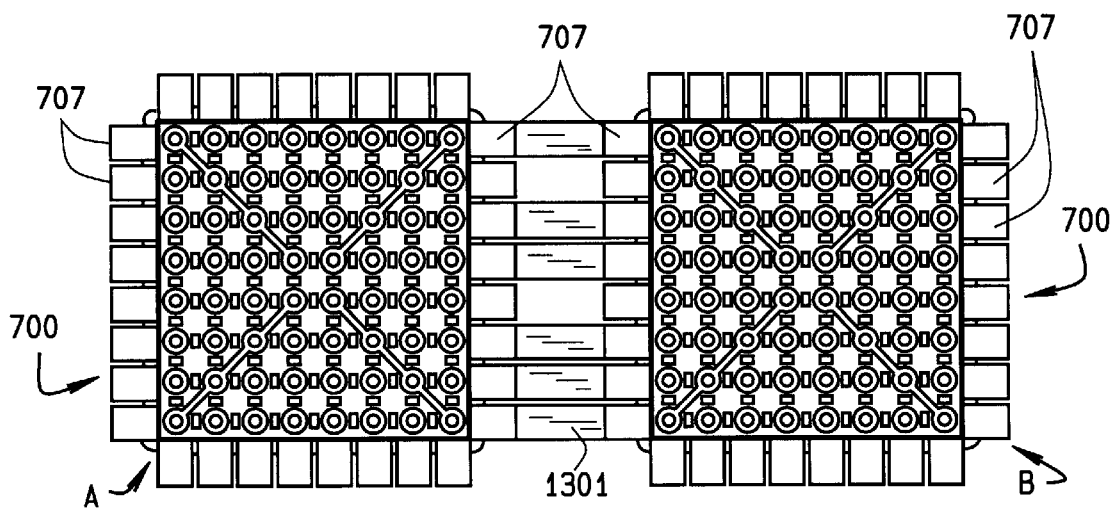
FIG. 13 is a top plan view of the middle layer of the stacked configuration of FIG. 11.
Figure 14:
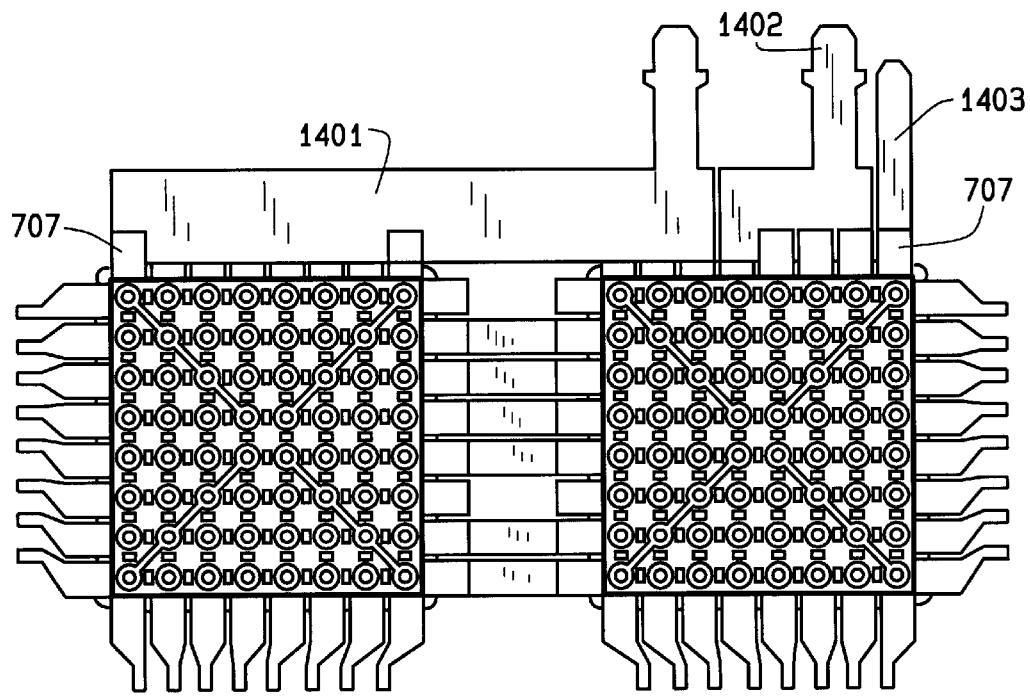
FIG. 14 is a top plan view of the bottom layer of the stacked configuration of FIG. 11.

FIGS. 12–14 are top plan views of the top, middle, and bottom conductive layers, respectively, of the stacked conductive layer configuration described above with reference to FIG. 11. FIG. 13 depicts the middle layer of the configuration, and shows that all of the electrical contacts (707) depending from the conductive circuit plates (700) of the middle layer are truncated. Of course, it is not necessary to truncate all of the electrical contacts on the conductive circuit plates of the central levels in a stacked configuration, but this truncation can make it easier to configure the electrical contacts for alignment with a mating electrical connector, and it helps to minimize the possibility of a short between closely spaced contacts.

FIG. 13 also illustrates electrical interconnection between adjacent, coplanar conductive circuit plates (700) of sides A and B. Conductive jumpers (1301), which may be formed from the same material as the conductive circuit plates and electrical contact extender portions, are disposed between selected facing truncated contacts (707) of adjacent conductive circuit plates (700). These conductive jumpers are electrically and mechanically connected to the selected ones of the truncated electrical contacts (707) by brazing, riveting, or soldering, or a combination of these, just as described above with reference to the electrical contact extender portions of FIG. 11. Since the hazard of a short circuit involving one of the unused truncated contacts is minimal, the unused contacts do not require further truncation, but may be shortened if desired.

FIG. 14 illustrates the interconnection of electrical contact extender portions (1401, 1403) to selected ones of the truncated electrical contacts (707) of the bottom level of the power distribution module. As will be noted in FIGS. 11 and 14, the electrical contact extender portions can provide both interconnection between adjacent, coplanar circuit plates and an off-module electrical connection capability (as in 1101), a way of tying multiple connections from one circuit plate to an off-module point (as in 1402), or a single extended connection to an off-module contact point (1403).

Figure 15:
FIG. 15 is a side elevational view of the stacked configuration of FIG. 11

FIG. 15 is a side elevational view of the power distribution module depicted in FIG. 11. Because the conductive jumpers (1301) joining adjacent coplanar circuit plates are formed from the same relatively stiff material as the circuit plates themselves, the completed power distribution module forms a relatively rigid and robust structure. Of course, the completed module would normally be disposed within a plastic housing (not shown) to provide weather resistance, additional structural strength, and means for supporting and securing electrical connector housings.

Figure 16:
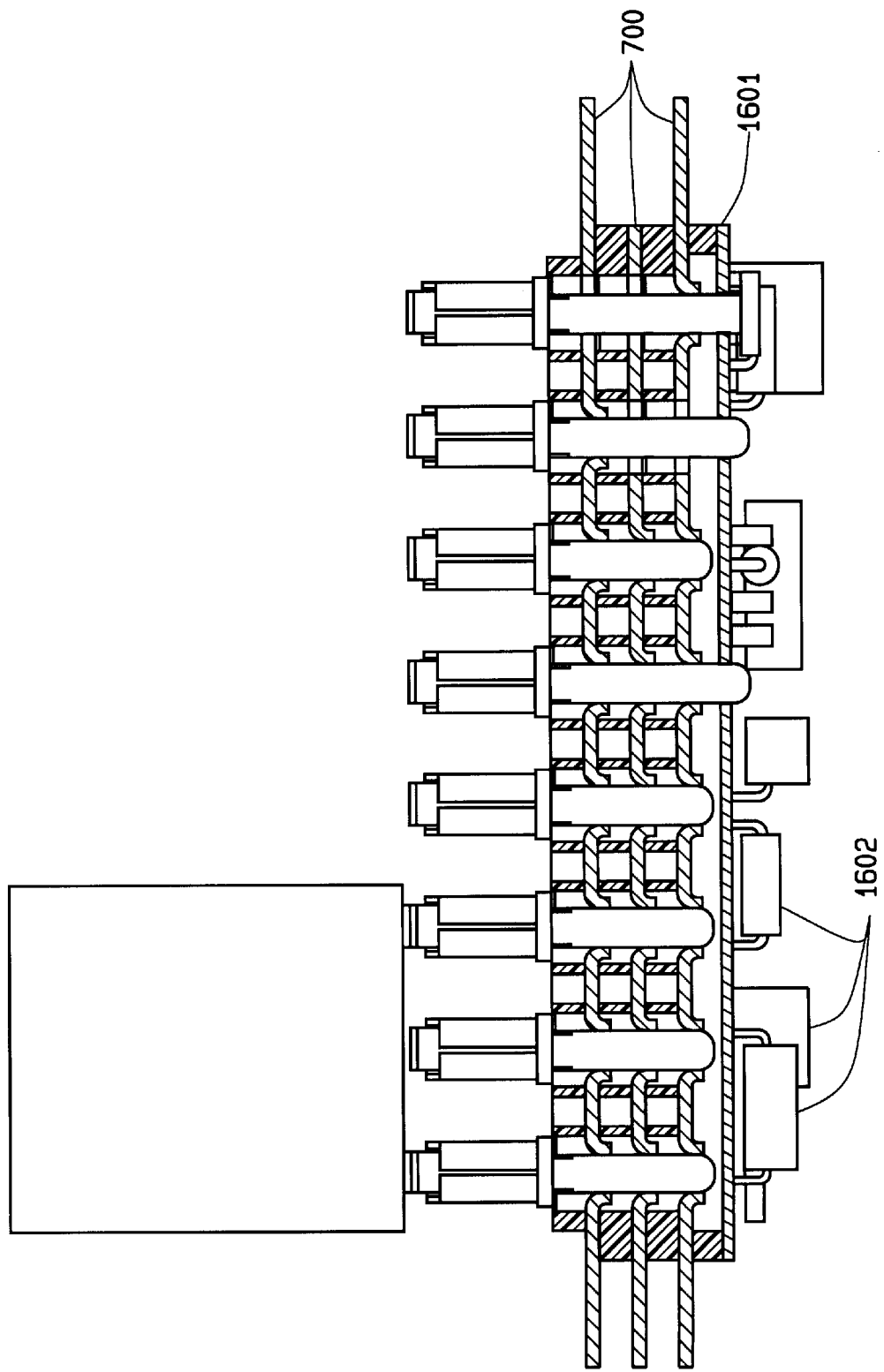
FIG. 16 is a side section view of a vertically stacked arrangement of conductive plates in combination with a printed circuit board.
Figure 17:
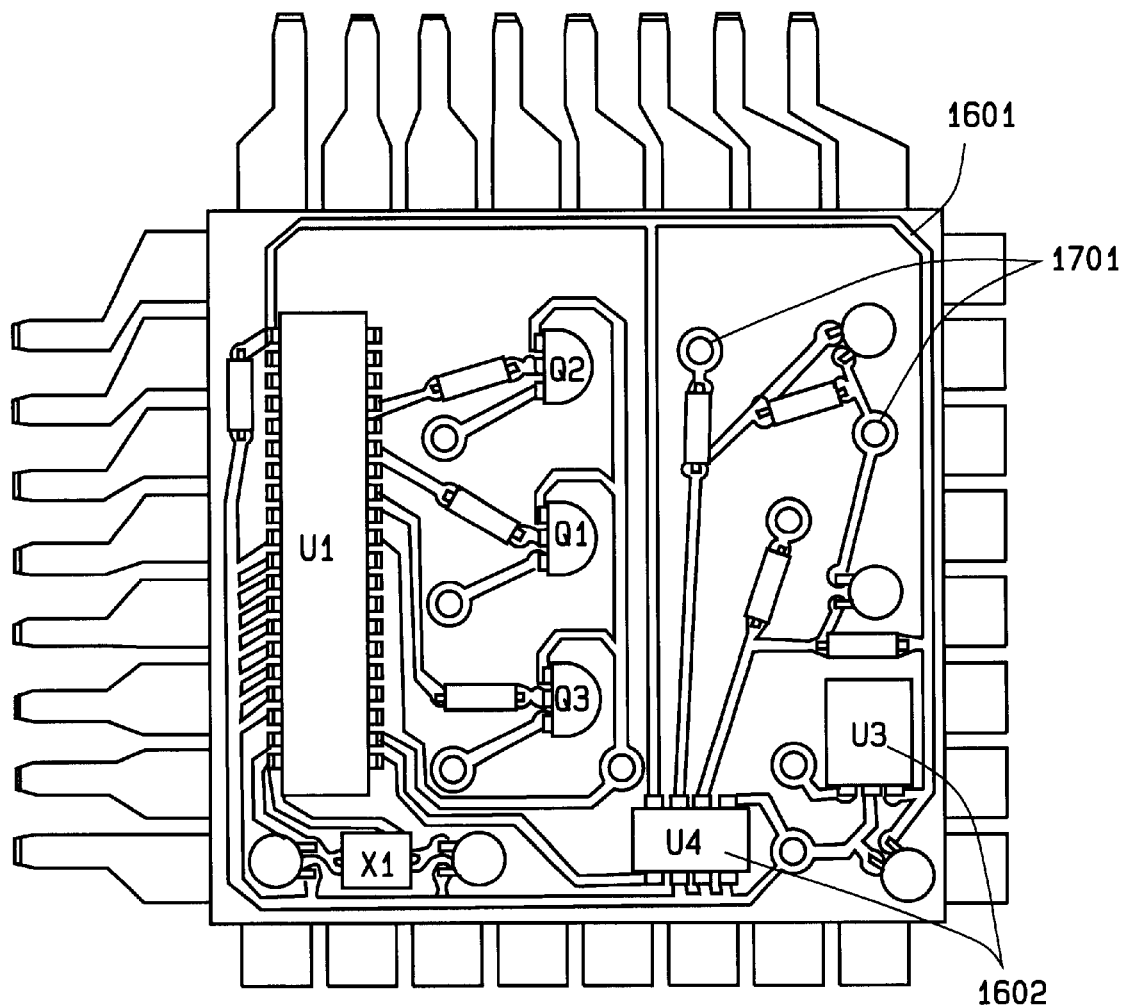
FIG. 17 is a bottom plan view of the embodiment of FIG. 16 illustrating the placement of electronic components on the circuit board.

FIGS. 16 and 17 illustrate the use of vertically stacked conductive circuit plates each having an appropriate spacer (701) and ridge (801) thereon in combination with a conventional printed circuit board. FIG. 16 is a side sectional view of a plurality of conductive circuit plates (700) arranged in a stacked vertical configuration, much as described with reference to FIG. 10, above. In addition, FIG. 16 illustrates the interconnection of electronic circuitry disposed on a printed circuit board (1601) with the electrical circuitry of the stacked conductive plate arrangement.

Electronic components (1602) are disposed on the printed circuit board (1601) in accordance with commonly accepted printed circuit board design guidelines. In a preferred form, the printed circuit board (1601) is a single-sided board having plated-through holes to facilitate connection with conductive pins that penetrate both the printed circuit board and the conductive plates that form the remaining layers. The use of a single sided printed circuit board is not a disadvantage, however, since necessary crossover connections can be implemented on one of the conductive plate layers, if necessary. The ability to achieve a high circuit density is one of the advantages of the inventive configuration.

Figure 18:
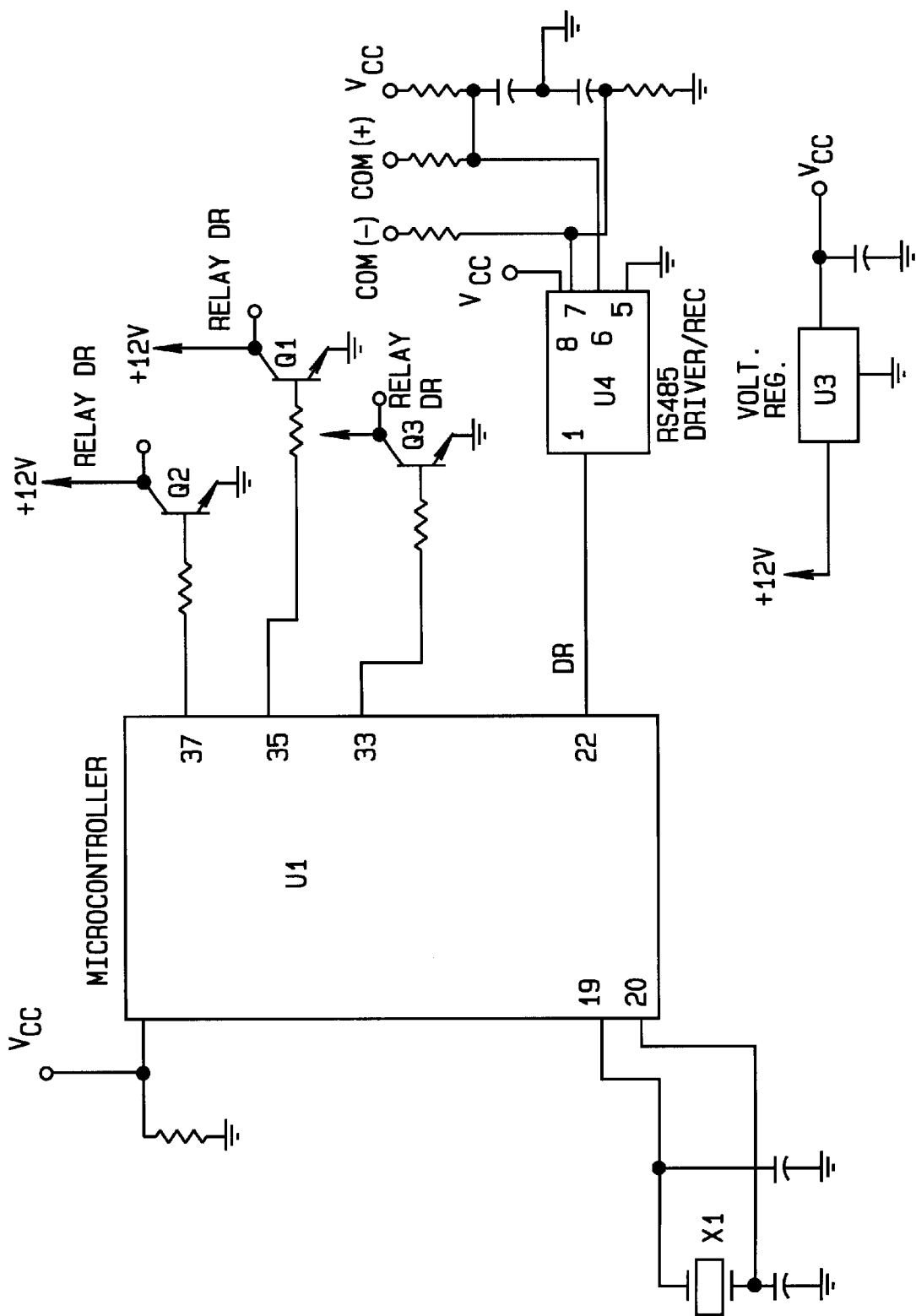
FIG. 18 is a schematic diagram of the circuitry illustrated in FIG. 17.

FIG. 18 is a schematic diagram of the electronic circuitry disposed on the printed circuit board of FIG. 17. As shown, even complicated circuitry such as microprocessor based control modules, may be implemented through a combination of a printed circuit board and a plurality of conductive plates in a stacked arrangement.

Figure 19:
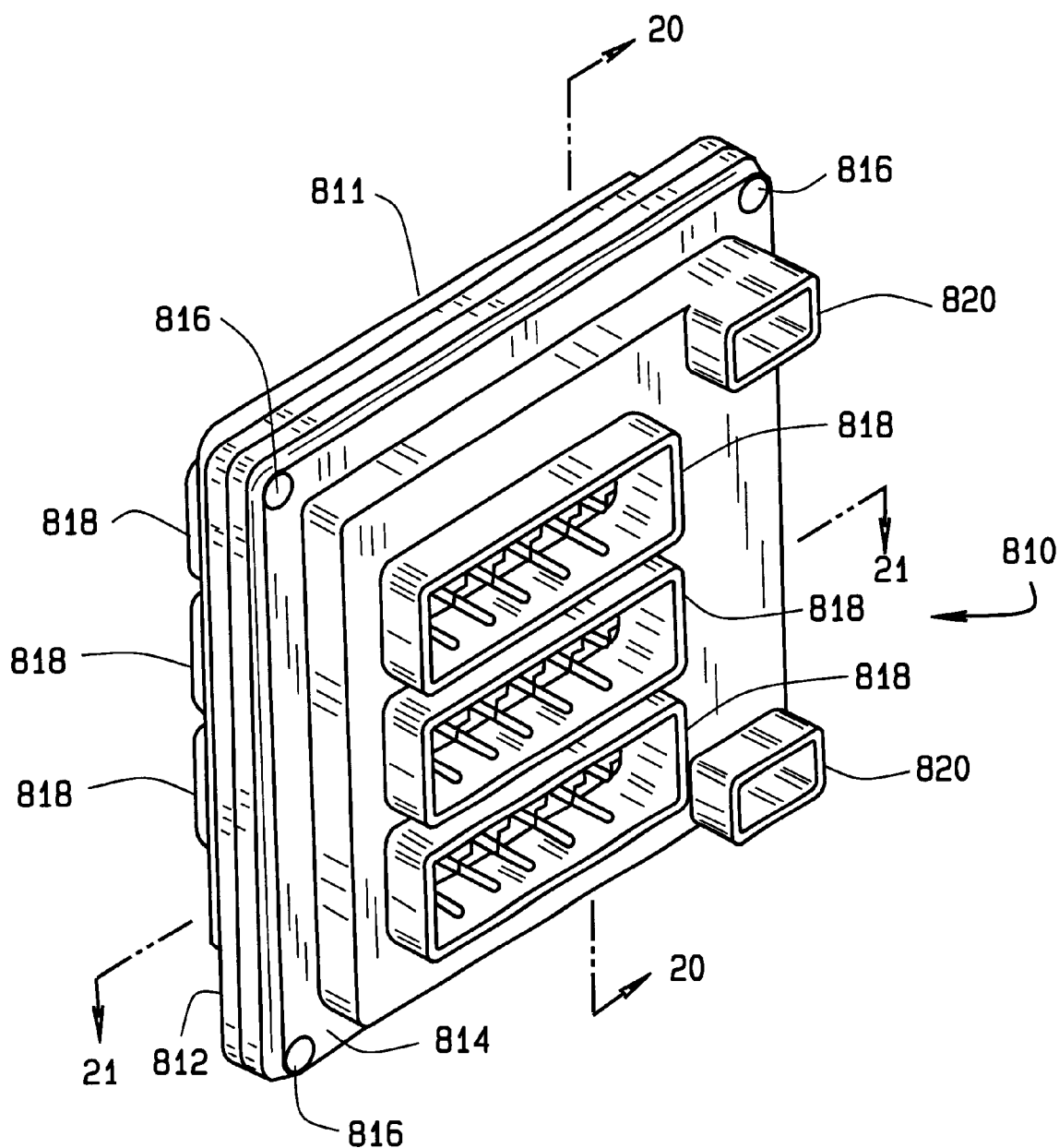
FIG. 19 is a perspective view of an alternative embodiment of the present invention.

FIG. 19 illustrates another embodiment of the present invention, which is sometimes referred to as a splicing box (810). The splicing box of FIG. 19 works according to the same principles of the embodiments described above.

Figure 20:
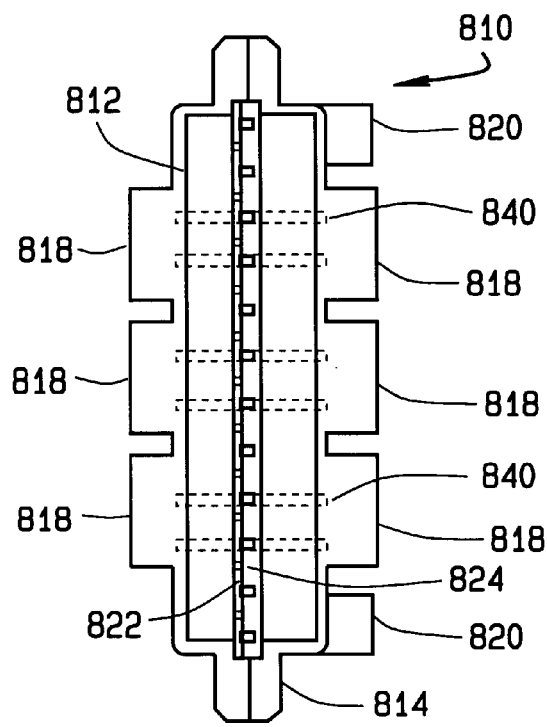
FIG. 20 is a cross section taken along line 20 of FIG. 19.
Figure 21:
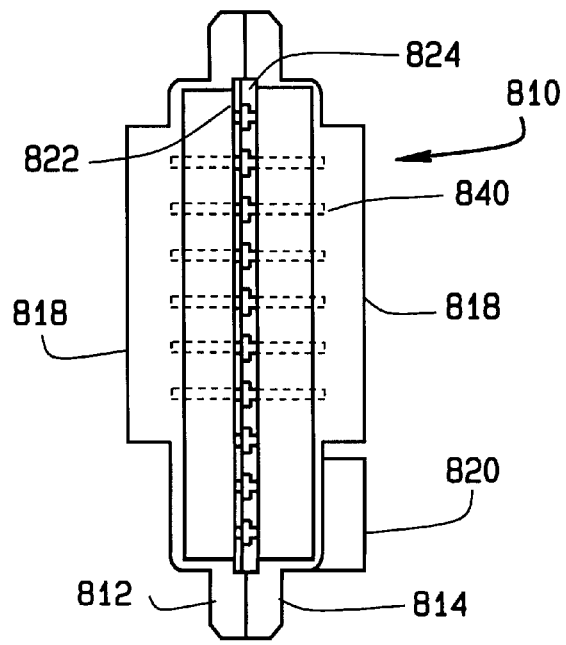
FIG. 21 is a cross section taken along line 21 of FIG. 19.

FIGS. 20 and 21 are cross-sectional views of the splicing box of FIG. 19. The splicing box (810) includes a nonconductive housing (811), preferably made from a thermoplastic polyester, which may be reinforced with 30% glass. However, one of skill in the art could identify other materials that may be used, instead. The housing (811) is preferably made from two halves (812, 814). The two halves of the housing may be secured by screws (816), or any other suitable means.

The housing (811) may include one or more openings or receptacles (818) for receiving connector assemblies (not shown). The receptacles (818) may be provided with a latch, or some kind of detente mechanism to releasably retain the connector within the receptacles (818). In addition, smaller openings or receptacles (820) may also be provided in the housing for receiving fuses or smaller electrical components.

In the particular embodiment illustrated in FIGS. 19–25, the receptacles (818) on one housing side (812) are in alignment with the receptacles (818) on the other housing side (814). However, it is not necessary for the receptacles (818) to be in alignment with each other. In fact, it is possible to have receptacles on only one side of the housing (811). The particular arrangement of connector receptacles depends on the application of the splicing box (810).

Figure 22:
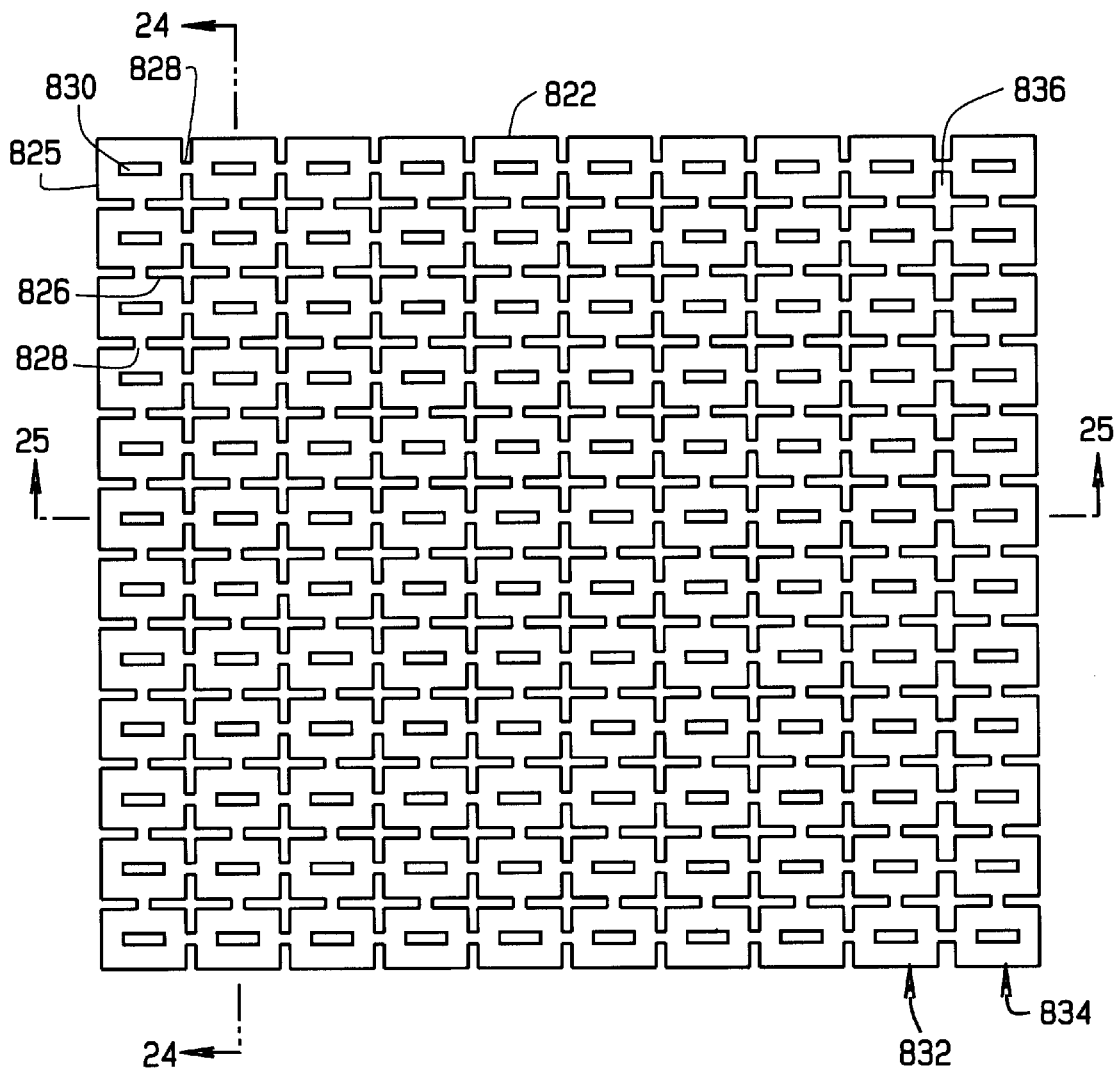
FIG. 22 is a plan view of a conductive plate used in the embodiment of FIG. 19.
Figure 23:
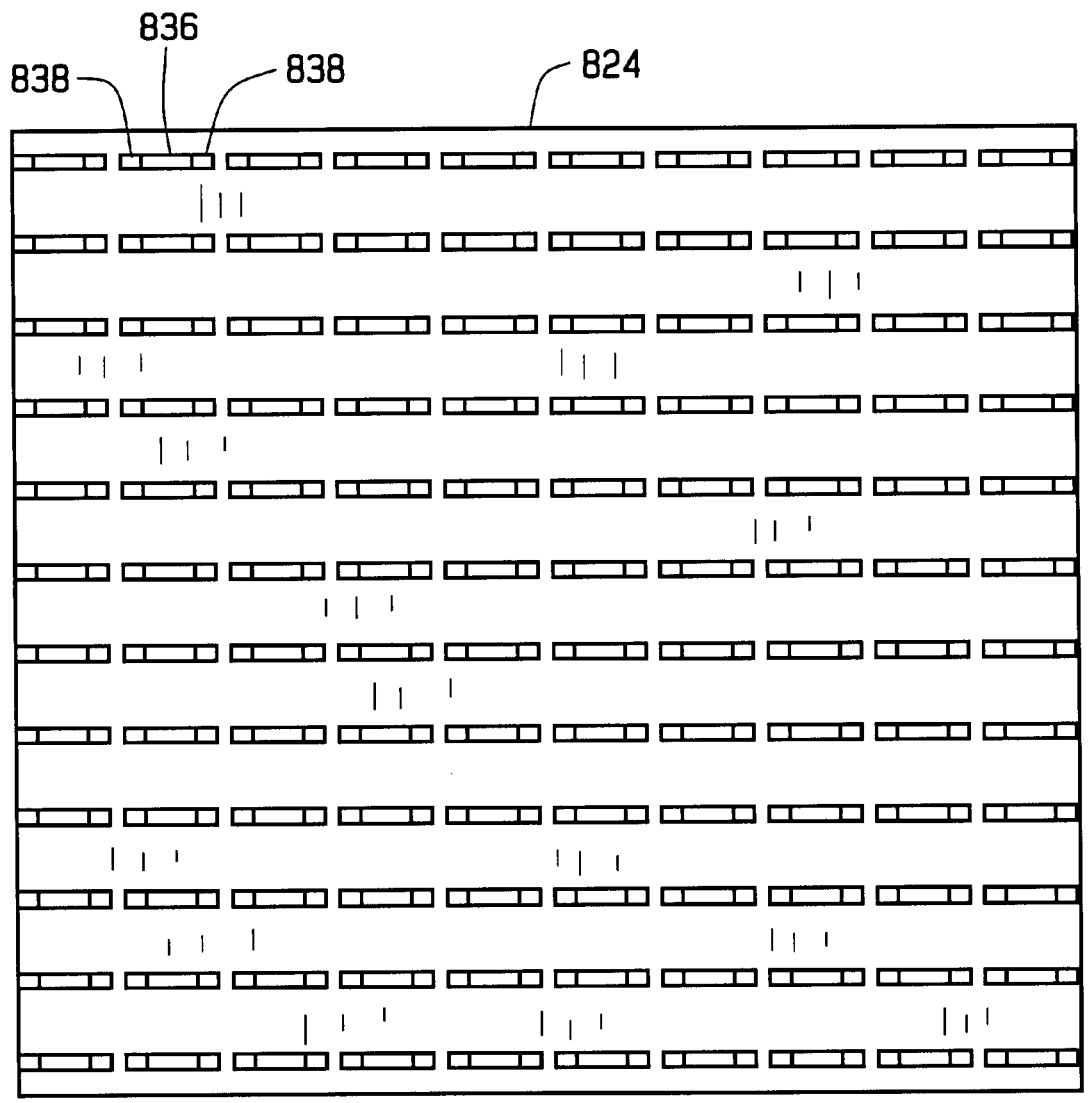
FIG. 23 is a plan view of an insulating plate used in the embodiment of FIG. 19.

Turning attention now to FIGS. 22 and 23, inside the housing are located a conductive plate (822) and an insulative plate (824). The conductive plate (822) includes a plurality of contact pads (825), which are preferably arranged in a rectangular grid pattern. However, the contact pads (825) may be arranged in any other design suitable for its intended purpose.

The contact pads (825) are separated from each other by cut-outs (826), such as cross-shaped cutouts. The arrangement of the cut-outs (826) leaves a plurality of connecting surfaces (828) joining adjacent contact pads (825). Electrical connection between adjacent contact pads (825) can be prevented by severing the connecting surfaces (828) between the two contact pads (825). In addition, an opening (830) is provided in each contact pad (825). In a preferred embodiment, the spacing between each column of contact pads (825) is uniform, with the exception of the last two columns. The spacing between the columns of contact pads is arranged to correspond to standard spacing between contacts in a connector assembly. In one embodiment, the columns of contact pads (825) are spaced at 6.9 mm, and the rows are spaced at 6.75 mm. However, any suitable spacing may be used.

The spacing between the last two columns is slightly larger than the spacing between the remaining columns in order to accommodate contacts from a fuse or other electrical components. In a preferred embodiment, the spacing between the last two columns (832, 834) is set at 8.1 mm to accommodate a standard automotive fuse, such as an ATM-style minifuse manufactured by the Bussmann Division of Cooper Industries, Inc. However, other spacings may be used. Other devices that may be used in the receptacles (820) include mini-circuit breakers, ATC circuit breakers, relays, flashers and diodes.

In a preferred embodiment, the smaller receptacles (820) in the housing (811) are designed to line up with the last two columns (832, 834) of the conductive plate (822). When the conductive plate (822) is in place within the housing (811), one opening (830) from column (832) and one opening (830) from column (834) are aligned with one of the receptacles (820) so as to accommodate the contacts from a device inserted into the receptacle (820). Another opening (830) from column (832) and another opening (830) from column (834) are aligned with the other of the receptacles (820).

The spacing of the columns of contact pads (825) is not critical to the present invention. The arrangement of the contact pads (825) may include any number of rows and columns, with either regular or irregular spacing. In fact, it is not necessary that the contact pads (825) be arranged in rows and columns, provided that they are connected by connecting surfaces that can be easily severed.

Figure 24:
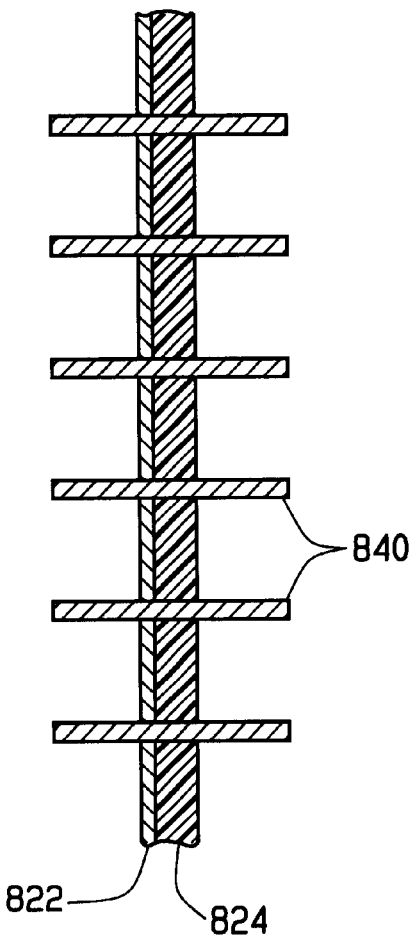
FIG. 24 is a cross section of the plates of FIGS. 22 and 23 used together, taken along line 24 of FIG. 22.
Figure 25:
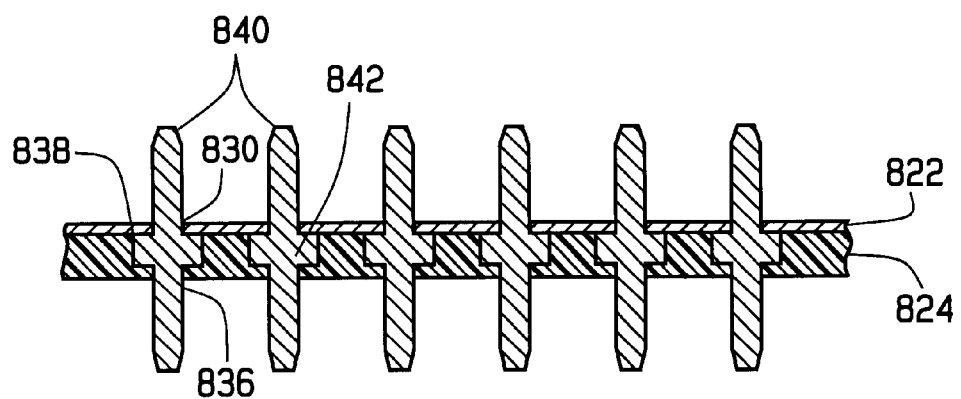
FIG. 25 is a cross section of the plates of FIGS. 22 and 23 used together, taken along line 25 of FIG. 22.

Turning attention now to FIG. 23, a nonconductive, insulative sheet or plate (824) is preferably, although not necessarily, provided with the same outer dimensions as the conductive plate (822). The nonconductive plate (824) includes a plurality of openings (836). Each of the openings (836) in the nonconductive plate (824) is aligned with a corresponding opening (830) in the conductive plate (822) when the conductive plate (822) and the nonconductive plate (824) are placed together, as shown in FIGS. 24 and 25. In addition to the openings (836), there are recessed areas (838) on each side of each opening (836) on one side of the plate (824). The specific arrangement of the recesses (838) and openings (836) can be better appreciated from FIG. 25. The specific shape of the openings (836) and recesses (838) in the nonconductive plate (824) are intended to facilitate retaining pins (840) in place within the conductive plate (822).

The pins (840) are made from a conductive material and are preferably of a size which fits tightly within the openings (830). The pins (840) may be tin or solder plated for corrosion protection.

In addition, each pin (840) may include a hilt (842). The hilt (842) is larger than the openings (830) in the conductive plate (822), and thus prevents the pin (840) from passing all the way through the openings (830) in the conductive plate (822). The size and shape of the hilt (842) of each pin (840) correspond to the recesses (838) associated with the openings (836) in the nonconductive plate (824). Accordingly, when pins (840) are inserted through the openings (830) in the conductive plate (822), and the nonconductive plate (824) is arranged adjacent the conductive plate (822), as illustrated in FIGS. 24 and 25, the pins (840), by means of the hilts (842), are trapped between the conductive plate (822) and the nonconductive plate (824).

Alternatively, the conductive plate (822), instead of the nonconductive plate (824), may include recesses for trapping the hilts (842) of the pins (840).

The pins (840) illustrated in this preferred embodiment have a cross-sectional shape that is substantially rectangular. However, the pins may be cylindrical, or any other shape. As best seen in FIGS. 20 and 21, the assembly of the nonconductive plate (824), the conductive plate (822), and pins (840) fit between the two housing halves (812, 814). It is not necessary or intended to provide pins (840) extending through every one of the openings (830) in the conductive plate (822). Instead, pins (840) are only inserted through the particular openings (830) that are intended to be in alignment with the receptacles (818), and which are necessary to form a connection with a connector (not shown) that may be plugged into the receptacles (818). The receptacles (818) may be provided with a latch, or some kind of detente mechanism to releasably retain the connector within the receptacles (818).

As an alternative, pins could be arranged that do not protrude from both sides of the conductive plate (822), but instead protrude from only one side of the plate (822). One embodiment could use some pins that protrude from both sides of the plate (822) and some pins that protrude from only one side of the plate (822). Pins that protrude from only one side of the plate may be secured by laser welding, or any other suitable attachment mechanism.

Figure 26:
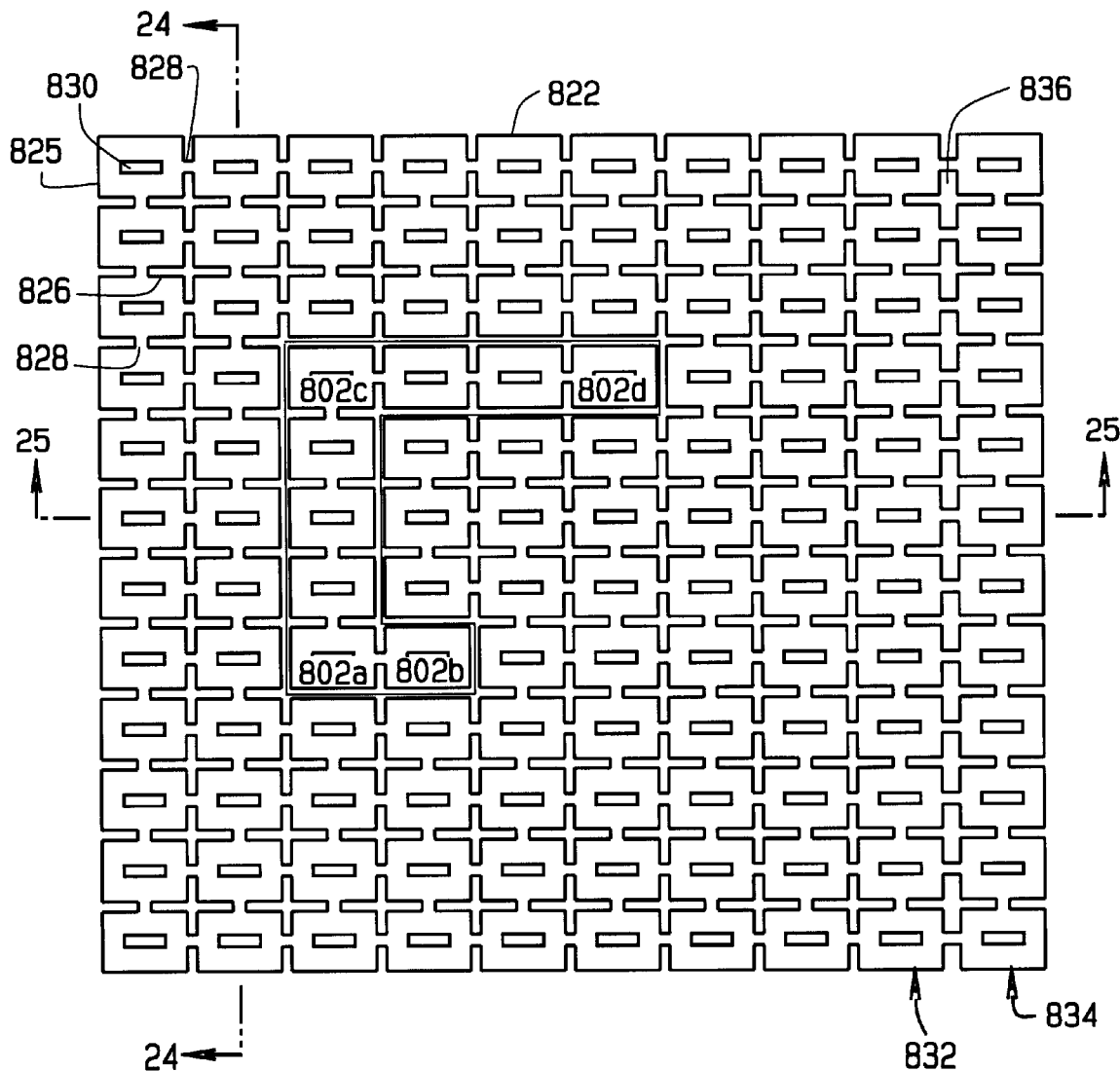
FIG. 26 illustrates a specific circuit using the embodiment of FIG. 19.

By selectively severing the connecting surfaces (828) between certain contacts pads (825), a wiring circuit may be constructed, wherein a circuit may be completed between two or more pins, as desired. For example, in the example shown in FIG. 26, several connecting surfaces (828) have been removed thus isolating contact pads (802a, 802b, 802c, and 802d). In addition, the contact pads between contact pads (802c) and (802d) and the contact pads between contact pad (802a) and contact pad (802c) are also connected. These contact pads (802a) through (802d) form a circuit that is isolated from the remainder of the conducting plate (822). Thus, pins extending through the openings (830) in contact pads (802a, 802b, 802c, and 802d) can be used to make connection with connecting blocks plugged into the receptacles (818).

In an actual example, there would likely be several independent circuits formed on one plate (822).

In the embodiments illustrated in FIGS. 19 through 26, the nonconducting plate (824) lies adjacent to the conducting layer (822), and is held in place within the housing (811) by the housing halves (812, 814). It is not necessary for the nonconducting plate (824) to be coated onto the conductive plate (824), or to otherwise use an adhesive to adhere the two plates (822, 824) together. Pressure from the two housing halves (812, 814) is sufficient to retain the two plates (822, 824) together. Nevertheless, one of ordinary skill in the art would appreciate that the nonconductive plate (824) could be adhered to the conductive plate (822) with an adhesive.

Alternatively, instead of using a distinct nonconductive plate (824), a layer of nonconductive material could be coated or insert molded onto the conductive plate (824), in a manner similar to the previously disclosed embodiments. In such an embodiment, the pins (840) may also be secured by friction, laser welding, or some other manner readily available to those of skill in the art.

Preferably, the conductive plate (822) in the FIG. 19 embodiment is a metal sheet having a thickness of about 0.5 to 1.3 mm. Other conductive materials of different thicknesses could be used, depending upon the intended use of the device. For vehicle uses, the preferred metal is copper. However, brass or stainless steel may also be used. In one embodiment, the conductive plate (822) may be stamped from a 0.08 mm CDA 110 half-hard copper. The thickness of the plate may be determined by the current requirements, wherein higher currents would require thicker plates. Currents of up to 30 amps can be used with the 0.08 mm copper plate. From a practical point of view, the actual limitations on currents are likely determined by the connectors used with the splicing box, rather than the thickness of the plate. Voltages of up to 50 Volts DC may be easily accommodated.

In general, the splicing box (810) and the power distribution boxes disclosed in this disclosure may be used to power almost any and all of the electrical devices in a vehicle, with the exception of the spark plug power. The power for the headlights, air conditioning, radios, etc. may all be distributed through either the splicing box, the power distribution box, or a combination of both.

To facilitate subsequent soldering operations, the plate (822) may be solder plated or coated to provide a solder layer thickness of about 0.005 to about 0.010 mm. The conductive material may be preplated or coated before the stamping operation, or a plating or coating may be added later. One of the preferred solder compositions for a copper base is a tin solder composition. Of course, other suitable compositions, known to those skilled in the art, may be substituted for the solder just described.

The nonconductive plate (824) may be made from any suitable nonconductive material. In a preferred embodiment, the nonconductive plate (824) is made from Rynite FR530, 94v-0, manufactured by E.I. Dupont Company. This material is described as a PET (polyethylene terephthalates) thermoplastic material. However, any number of insulating plastic or other materials would serve in this application.

According to another feature of the present invention, the terminal spring (501), illustrated in FIGS. 5a through 5c, and described above, may be used in combination with the pins (840) of the FIG. 19 embodiment.

When programming the conductive plate (822), i.e., stamping out the undesired connecting surfaces (828) from the conductive plate (822), it will become apparent that one or more groups of contact pads (825) may be completely isolated from the remainder of the conductive plate (822). See for example contact pads (802a, 802b, 802c, and 802d) in FIG. 26. In order to retain the "island" of contact pads in its respective place within the conductive plate (822), a layer of thin, nonconductive tape may be adhered to one surface of the conductive plate (822). Thus, as the connecting surfaces (828) are severed from the conductive plate (822), any islands of contact pads will retain their proper relative position because of the tape. If the nonconductive plate (824) is secured to the conductive plate (822) with an adhesive, the use of the tape to retain the islands of contact pads will not be necessary.

After the pins have been inserted and locked between the conductive plate (822) and nonconductive plate (824), the plates and pins (840) may be secured by heating the assembly in order to reflow the solder coating on the conductive plate (822). The reflowing of the solder enhances the electrical connection between the plate (822) and the pins (840), and helps to secure the pins (840) within the plate (822). As an alternative to using reflowed solder, a laser welding process may be used to secure the pins (840) to the plate (822). In such a case, there is no need to coat the plate (822) with solder.

Although the FIG. 19 embodiment discloses only one conductive plate (822) and one nonconductive plate (824), any combination of conductive and nonconductive plates may be used, provided that the conductive plates are separated by nonconductive plates or layers. For example, a device may include one conductive layer surrounded by two nonconductive layers. Alternatively, it is possible that a single conductive plate may be used without a nonconductive plate or layer. However, in such a case, it may be necessary to use a layer of taper or adhesive on the conductive plate (822) to retain any islands of pads in their proper place.

In an embodiment using more than one conductive plate (822), it may be necessary to enlarge some of the openings (830) so that some of the pins (840) extending through some of the holes (830) do not make contact with the conductive pad (825) surrounding the opening (830). This principle is much the same as that set forth above with respect to opening (703a), illustrated in FIG. 10, and described above.

With respect to the embodiments disclosed in FIGS. 1–18, instead of coating a layer of nonconductive material onto the conductive plates, as described above with respect to those embodiments, as an alternative, a discreet, separate, nonconductive plate may be arranged between the conductive plates, similar to the manner disclosed in the FIG. 19 embodiment. It is not necessary for the nonconductive plates to be adhered to or coated onto the conductive plates in order to form the completed assembly.

The inventors have described herein an electric power distribution apparatus and a splicing box that are inexpensive to produce, easily adapted for specific model applications, and durably packaged. Although several of the inventive features are described with particularity in the appended claims, it should be understood that there may be variations of the inventive concept that, while not explicitly claimed, nonetheless fall within the spirit and scope of the invention.

What is claimed is:

1. A power distribution apparatus comprising:
    a conductive plate, said plate including an array of contact pads;
    each of the contact pads including means for receiving a connector pin;
    a plurality of removable connector links interconnecting the contact pads, wherein discrete circuits can be formed on said conductive plate by selectively removing a portion of said removable connector links;
    a nonconductive layer adjacent said conductive plate, said conductive plate and said nonconductive plate having matching openings;
    a plurality of pins extending through a portion of said openings to form electric contacts; and
    said nonconductive layer includes recesses adjacent said openings on a side of said nonconductive layer facing said conductive plate for entrapping a hilt on each of said pins.

2. The power distribution apparatus of claim 1, further comprising a housing for retaining said nonconductive layer and said conductive plate, said housing including receptacles for connector assemblies that engage with said electric contacts.

3. A method of assembling a power distribution apparatus, comprising the steps of:
    providing a conductive plate, said conductive plate including a plurality of contact pads that are interconnected by removable connecting links;
    providing a nonconductive layer adjacent said conductive plate;
    selectively removing a portion of said connecting links to form discrete circuits on said conductive plate;
    mounting contact pins to selected contact pads; and
    securing a portion of each of said contact pins between said conductive plate and said nonconductive layer.

4. The method of claim 3, further comprising mounting said conductive plate in a nonconductive housing that is adapted to receive connector assemblies that are aligned with said contact pins.

5. A power distribution apparatus comprising:
    a conductive plate, said plate comprising an array of contact pads and a plurality of removable connector links interconnecting said contact pads, each of said contact pads comprising an opening therethrough for receiving a connector pin; wherein discrete circuits can be formed on said conductive plate by selectively removing a portion of said removable connector links;
    a nonconductive plate adjacent said conductive plate and having a plurality of openings therethrough, said openings of said nonconductive plate aligned with said openings of said conductive plate, one of said conductive layer and said nonconductive layer comprising at least one recess adjacent at least one opening and facing the other of said conductive layer and nonconductive layer; and
    a plurality of pins extending through a portion of said openings to form electric contacts, at least one pin including a portion larger than said openings and received in said at least one recess, thereby securing said pin between said conductive plate and nonconductive plate.

6. A power distribution apparatus in accordance with claim 5 wherein said portion of said pin comprises a hilt.

7. A power distribution apparatus in accordance with claim 5 further comprising a housing enclosing said conductive plate and said nonconductive plate; said housing comprising at least one connector receptacle aligned with said pins.

8. A power distribution apparatus in accordance with claim 7 said housing further comprising a first side, a second side, and a plurality of connector receptacles, at least one connector receptacle located on each of said first and second sides.

9. A power distribution apparatus comprising:
    a housing comprising a first side, a second side, and at least one connector receptacle extending from said first side and said second side;
    a conductive plate within said housing, said conductive plate including a plurality of contact pads that are interconnected by removable connecting links, each of said contact pads including openings for receiving a connector pin, wherein a portion of said connecting links are removable to create a circuit on said conductive plate; and
    a nonconductive plate adjacent said conductive plate within said housing; and a plurality of connector pins selectively mounted to a portion of said openings through said conductive plate, at least one of said connector pins comprising a hilt.

10. A power distribution apparatus in accordance with claim 9, wherein said hilt is received in a recess in one of said conductive plate and said nonconductive plate and securing said hilt therebetween.

11. A power distribution apparatus in accordance with claim 9 wherein said connector receptacles are aligned with said pins.

12. A power distribution apparatus in accordance with claim 9 wherein said pins are substantially rectangular.

* * * * *